United States Patent
Mochizuki (12)

(10) Patent No.: US 9,269,874 B2
(45) Date of Patent: Feb. 23, 2016

(54) SEALING MATERIAL FOR LIGHT EMITTING DEVICE, LIGHT EMITTING DEVICE USING THE SAME, AND MANUFACTURING METHOD FOR LIGHT EMITTING DEVICE

(71) Applicant: Konica Minolta, Inc., Tokyo (JP)

(72) Inventor: Makoto Mochizuki, Koganei (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/404,183

(22) PCT Filed: May 31, 2013

(86) PCT No.: PCT/JP2013/065151
§ 371 (c)(1),
(2) Date: Nov. 26, 2014

(87) PCT Pub. No.: WO2013/180259
PCT Pub. Date: Dec. 5, 2013

(65) Prior Publication Data
US 2015/0188007 A1    Jul. 2, 2015

(30) Foreign Application Priority Data

May 31, 2012   (JP) .................................. 2012-124166

(51) Int. Cl.
*H01L 33/00* (2010.01)
*H01L 33/56* (2010.01)
(Continued)

(52) U.S. Cl.
CPC . *H01L 33/56* (2013.01); *C08K 3/22* (2013.01); *C08L 83/04* (2013.01); *H01L 33/507* (2013.01);
(Continued)

(58) Field of Classification Search
CPC ....................................................... H01L 33/56
USPC ............................................................ 257/98
See application file for complete search history.

(56) References Cited

U.S. PATENT DOCUMENTS 5,844,060 A    12/1998   Furuya et al.
5,998,522 A    12/1999   Nakano et al.
(Continued)

FOREIGN PATENT DOCUMENTS

EP    1879234 A2    1/2008
EP    2800154 A1    11/2014
(Continued)

OTHER PUBLICATIONS

Extended European Search Report

*Primary Examiner* — Anthony Ho
(74) *Attorney, Agent, or Firm* — Lucas & Mercanti, LLP

(57) ABSTRACT

The present invention is intended to provide a sealing material for a light emitting device, which is able achieve both the adhesiveness and the crack resistance, have the high sulfurization resistance and the wet heat resistance, and seal the light emitting element. The sealing material for a light emitting device for sealing a light emitting element is characterized in that in a solid Si-nuclear magnetic resonance spectrum, a peak has a peak top in a chemical shift within a range of −120 ppm or more and −90 ppm or less, and a half width of 5 ppm or more and 12 ppm or less; in the solid Si-nuclear magnetic resonance spectrum, a peak has a peak top in a chemical shift within a range of −80 ppm or more and −40 ppm or less, and a half width of 5 ppm or more and 12 ppm or less; and a silanol content ratio is 11% by weight or more and 30% by weight or less.

11 Claims, 9 Drawing Sheets

(51) Int. Cl.
*C08L 83/04* (2006.01)
*C08K 3/22* (2006.01)
*C08G 77/16* (2006.01)
*H01L 33/50* (2010.01)

(52) U.S. Cl.
CPC ............... *C08G 77/16* (2013.01); *H01L 33/501* (2013.01); *H01L 2933/005* (2013.01); *H01L 2933/0041* (2013.01)

(56) References Cited

U.S. PATENT DOCUMENTS

| | | | |
|---|---|---|---|
| 2008/0012074 | A1 | 1/2008 | Braymer et al. |
| 2009/0008673 | A1 | 1/2009 | Kato et al. |
| 2009/0309116 | A1* | 12/2009 | Kato .................. C09K 11/7721 257/98 |
| 2012/0100298 | A1 | 4/2012 | Moriyama et al. |
| 2015/0221837 | A1 | 8/2015 | Yonezaki et al. |

FOREIGN PATENT DOCUMENTS

| | | |
|---|---|---|
| JP | 09-071654 A | 3/1997 |
| JP | 2003-292626 A | 10/2003 |
| JP | 2005-309215 A | 11/2005 |
| JP | 2006-229221 A | 8/2006 |
| JP | 2007-112974 A | 5/2007 |
| JP | 2007-112975 A | 5/2007 |
| JP | 2009-2767 A | 11/2009 |
| JP | 2011-026570 A | 2/2011 |
| JP | 2011-159912 A | 8/2011 |

* cited by examiner

FIG. 3A

| | Peak top position and presence/absence (half width is shown in parentheses) | | | | | | | Silanol content ratio [%] | Evaluation | | | |
|---|---|---|---|---|---|---|---|---|---|---|---|---|
| | Q^N peak group | | T^N peak group | | D^N peak group | | | | Adhesiveness | Crack resistance | Sulfurization resistance | Wet heat resistance |
| | | -120~-90ppm | | -80~-45ppm | | -40~0ppm | | | | | | |
| Example 1 | Presence | (5ppm) | Presence | (5ppm) | Absence | – | 20 | ○ | ○ | ○ | ○ |
| Example 2 | Presence | (9ppm) | Presence | (9ppm) | Absence | – | 20 | ○ | ○ | ○ | ○ |
| Example 3 | Presence | (12ppm) | Presence | (12ppm) | Absence | – | 20 | ○ | ○ | ○ | ○ |
| Example 4 | Presence | (5ppm) | Presence | (5ppm) | Presence | (5ppm) | 20 | ○ | ○ | ○ | ○ |
| Example 5 | Presence | (9ppm) | Presence | (9ppm) | Presence | (9ppm) | 20 | ○ | ○ | ○ | ○ |
| Example 6 | Presence | (12ppm) | Presence | (12ppm) | Presence | (12ppm) | 20 | ○ | ○ | ○ | ○ |
| Example 7 | Presence | (9ppm) | Presence | (9ppm) | Presence | (9ppm) | 11 | ○ | ○ | ○ | ○ |
| Example 8 | Presence | (12ppm) | Presence | (12ppm) | Presence | (12ppm) | 30 | ○ | ○ | ○ | ○ |
| Comparative Example 1 | Presence | (15ppm) | Absence | – | Absence | – | 35 | ○ | × | × | × |
| Comparative Example 2 | Absence | – | Presence | (8ppm) | Presence | (2ppm) | 20 | △ | ○ | × | × |
| Comparative Example 3 | Absence | – | Absence | – | Presence | (15ppm) | 8 | × | ○ | × | × |
| Comparative Example 4 | Absence | – | Presence | (8ppm) | Presence | (8ppm) | 8 | △ | ○ | × | × |
| Comparative Example 5 | Presence | (8ppm) | Absence | – | Presence | (8ppm) | 20 | ○ | △ | × | × |
| Comparative Example 6 | Presence | (2ppm) | Presence | (2ppm) | Absence | – | 20 | △ | ○ | × | × |
| Comparative Example 7 | Presence | (15ppm) | Presence | (15ppm) | Absence | – | 20 | ○ | × | × | × |
| Comparative Example 8 | Presence | (2ppm) | Presence | (2ppm) | Presence | (2ppm) | 8 | × | ○ | × | × |
| Comparative Example 9 | Presence | (15ppm) | Presence | (15ppm) | Presence | (15ppm) | 20 | △ | × | × | × |

FIG. 3B

| | | PEAK TOP POSITION AND PRESENCE/ABSENCE (HALF WIDTH IS SHOWN IN PARENTHESES) | | | | EVALUATION | | | | |
|---|---|---|---|---|---|---|---|---|---|---|
| | INORGANIC OXIDE PARTICLES | $Q^N$ PEAK GROUP $-120\sim-90$ ppm | $T^N$ PEAK GROUP $-80\sim-45$ ppm | $D^N$ PEAK GROUP $-40\sim0$ ppm | SILANOL CONTENT RATIO [%] | ADHESIVENESS | THE CRACK RESISTANCE | SULFURIZATION RESISTANCE | WET HEAT RESISTANCE | LIGHT EXTRACTION EFFICIENCY |
| EXAMPLE 5 | ABSENCE | PRESENCE (9 ppm) | PRESENCE (9 ppm) | PRESENCE (9 ppm) | 20 | ○ | ○ | ○ | ○ | ○ |
| EXAMPLE 9 | $ZrO_2$ | PRESENCE (9 ppm) | PRESENCE (9 ppm) | PRESENCE (9 ppm) | 20 | ◎ | ◎ | ○ | ○ | ◎ |
| EXAMPLE 10 | $TiO_2$ | PRESENCE (9 ppm) | PRESENCE (9 ppm) | PRESENCE (9 ppm) | 20 | ◎ | ◎ | ○ | ○ | ○ |
| EXAMPLE 11 | $Al_2O_3$ | PRESENCE (9 ppm) | PRESENCE (9 ppm) | PRESENCE (9 ppm) | 20 | ◎ | ◎ | ○ | ○ | ○ |

FIG. 3C

| | CURING TEMPERATURE | PEAK TOP POSITION AND PRESENCE/ABSENCE (HALF WIDTH IS SHOWN IN PARENTHESES) | | | SILANOL CONTENT RATIO [%] | EVALUATION | | | | | |
|---|---|---|---|---|---|---|---|---|---|---|---|
| | | $Q^N$ PEAK GROUP $-120\sim-90$ ppm | $T^N$ PEAK GROUP $-80\sim-45$ ppm | $D^N$ PEAK GROUP $-40\sim0$ ppm | | ADHESIVENESS | THE CRACK RESISTANCE | SULFURIZATION RESISTANCE | WET HEAT RESISTANCE | LIGHT RESISTANCE |
| EXAMPLE 12 | 80°C | PRESENCE (9 ppm) | PRESENCE (9 ppm) | PRESENCE (9 ppm) | 20 | ○ | ◎ | ○ | ○ | △ |
| EXAMPLE 13 | 100°C | PRESENCE (9 ppm) | PRESENCE (9 ppm) | PRESENCE (9 ppm) | 20 | ○ | ○ | ○ | ○ | ○ |
| EXAMPLE 5 | 150°C | PRESENCE (9 ppm) | PRESENCE (9 ppm) | PRESENCE (9 ppm) | 20 | ○ | ○ | ○ | ○ | ○ |

FIG. 3D

| | FILM THICKNESS [μm] | PEAK TOP POSITION AND PRESENCE/ABSENCE (HALF WIDTH IS SHOWN IN PARENTHESES) | | | SILANOL CONTENT RATIO [%] | EVALUATION | | | | |
|---|---|---|---|---|---|---|---|---|---|---|
| | | $Q^N$ PEAK GROUP -120~-90ppm | $T^N$ PEAK GROUP -80~-45ppm | $D^N$ PEAK GROUP -40~0ppm | | ADHESIVENESS | THE CRACK RESISTANCE | SULFURIZATION RESISTANCE | WET HEAT RESISTANCE | CHROMATICITY VARIATION |
| EXAMPLE 5 | 10 | PRESENCE(9 ppm) | PRESENCE(9 ppm) | PRESENCE(9 ppm) | 20 | ○ | ○ | ○ | ○ | ○ |
| EXAMPLE 14 | 100 | PRESENCE(9 ppm) | PRESENCE(9 ppm) | PRESENCE(9 ppm) | 20 | ○ | ○ | ○ | ○ | ○ |
| EXAMPLE 15 | 450 | PRESENCE(9 ppm) | PRESENCE(9 ppm) | PRESENCE(9 ppm) | 20 | ○ | ○ | ○ | ○ | ○ |

FIG. 3E

| | FILM THICKNESS [μm] | PEAK TOP POSITION AND PRESENCE/ABSENCE (HALF WIDTH IS SHOWN IN PARENTHESES) | | | SILANOL CONTENT RATIO [%] | EVALUATION | | | | |
|---|---|---|---|---|---|---|---|---|---|---|
| | | $Q^N$ PEAK GROUP -120~-90 ppm | $T^N$ PEAK GROUP -80~-45 ppm | $D^N$ PEAK GROUP -40~0 ppm | | ADHESIVENESS | THE CRACK RESISTANCE | SULFURIZATION RESISTANCE | WET HEAT RESISTANCE |
| EXAMPLE 16 | 0.7 | PRESENCE (9 ppm) | PRESENCE (9 ppm) | PRESENCE (9 ppm) | 20 | ○ | ○ | ○ | ○ |
| EXAMPLE 17 | 1.5 | PRESENCE (9 ppm) | PRESENCE (9 ppm) | PRESENCE (9 ppm) | 20 | ○ | ○ | ◎ | ○ |
| EXAMPLE 18 | 5 | PRESENCE (9 ppm) | PRESENCE (9 ppm) | PRESENCE (9 ppm) | 20 | ○ | ○ | ◎ | ○ |
| EXAMPLE 19 | 15 | PRESENCE (9 ppm) | PRESENCE (9 ppm) | PRESENCE (9 ppm) | 20 | ○ | ○ | ○ | ○ |

FIG. 3F

| | CYCLIC ETHER COMPOUND | SILANE COUPLING AGENT | PEAK TOP POSITION AND PRESENCE/ABSENCE (HALF WIDTH IS SHOWN IN PARENTHESES) | | | SILANOL CONTENT RATIO [%] | EVALUATION | | | | |
|---|---|---|---|---|---|---|---|---|---|---|---|
| | | | $Q^N$ PEAK GROUP −120~−90ppm | $T^N$ PEAK GROUP −80~−45ppm | $D^N$ PEAK GROUP −40~0ppm | | ADHESIVENESS | THE CRACK RESISTANCE | SULFURIZATION RESISTANCE | WET HEAT RESISTANCE | |
| EXAMPLE 9 | ABSENCE | ABSENCE | PRESENCE (9ppm) | PRESENCE (9ppm) | PRESENCE (9ppm) | 20 | ○ | ○ | ○ | ○ | |
| EXAMPLE 20 | DIBENZO-18-CROWN 6-ETHER | ABSENCE | PRESENCE (9ppm) | PRESENCE (9ppm) | PRESENCE (9ppm) | 20 | ○ | ○ | ○ | ◎ | |
| EXAMPLE 21 | ABSENCE | AMINO-SILANE COUPLING AGENT | PRESENCE (9ppm) | PRESENCE (9ppm) | PRESENCE (9ppm) | 20 | ○ | ○ | ○ | ◎ | |
| EXAMPLE 22 | ABSENCE | MERCAPTO-SILANE COUPLING AGENT | PRESENCE (9ppm) | PRESENCE (9ppm) | PRESENCE (9ppm) | 20 | ◎ | ○ | ◎ | ◎ | |
| EXAMPLE 23 | DIBENZO-18-CROWN 6-ETHER | AMINO-SILANE COUPLING AGENT | PRESENCE (9ppm) | PRESENCE (9ppm) | PRESENCE (9ppm) | 20 | ○ | ○ | ○ | ◎ | |
| EXAMPLE 24 | DIBENZO-18-CROWN 6-ETHER | MERCAPTO-SILANE COUPLING AGENT | PRESENCE (9ppm) | PRESENCE (9ppm) | PRESENCE (9ppm) | 20 | ◎ | ○ | ◎ | ◎ | |

SEALING MATERIAL FOR LIGHT EMITTING DEVICE, LIGHT EMITTING DEVICE USING THE SAME, AND MANUFACTURING METHOD FOR LIGHT EMITTING DEVICE

CROSS REFERENCE TO RELATED APPLICATION

This Application is a 371 of PCT/JP2013/065151 filed on May 31, 2013 which, in turn, claimed the priority of Japanese Patent Application No. JP2012-124166 filed on May 31, 2012 both applications are incorporated herein by reference.

TECHNICAL FIELD

The present invention relates to a technique for sealing light emitting element in a light emitting device.

BACKGROUND ART

In recent years, there has been a widely used technology for obtaining a white light emitting device in which a phosphor, such as YAG (yttrium-aluminum-garnet) phosphor, or the like, is arranged in the vicinity of a gallium nitride (GaN) based blue LED (Light Emitting Diode) chip. In such the white light emitting device, white light emission is provided by mixing blue light emitted from the blue LED chip and yellow light emitted by secondary light emission from the phosphor which has received the blue light. It has also been used a technology for providing white light emission by mixing the blue light emitted from the blue LED chip and red light along with green light emitted by secondary light emission from each phosphor which has received the blue light.

There are various applications for such the white light emitting device, and for example, there is a demand for the device as a substitute product of a fluorescent lamp or an incandescent lamp. Further, the device tends to be used for light emitting devices, such as an automobile head light, and the like, requiring extremely high luminance.

PRIOR ART DOCUMENT

Patent Document

[Patent Document 1] Japanese Unexamined Patent Application Publication No. 2007-112974
[Patent Document 2] Japanese Unexamined Patent Application Publication No. 2007-112975

SUMMARY OF THE INVENTION

Problems to be Solved by the Invention

In such the light emitting device, a transparent resin, or the like, is typically used to seal a light emitting element (for example, LED (Light Emitting Diode) element).

The purposes of the sealing in the above manner include, for example, suppression of corrosion caused by sulfide gases and wet heat resistance, for metal materials, such as electrodes, reflection plates, and the like, of a semiconductor light emitting device. It is known that a silicone resin is excellent in heat resistance and ultraviolet light resistance, and is typically used as a sealing material for the semiconductor light emitting device. Among such the silicone resins, resins having high sulfurization resistance, such as phenyl silicone resin, for example, also exist. Even higher sulfurization resistance is however required for the light emitting device used in outdoor environment, and sealing with the silicone resin dose not always satisfy the requirement. Further, adhesiveness and a crack resistance are expected for fixing phosphor on a light emitting element.

On the other hand, in Patent Documents 1 and 2, an example of the sealing material for the light emitting device for sealing such the light emitting device is described. In Patent Documents 1 and 2, a solid Si-nuclear magnetic resonance spectrum is used as a method for checking a substance composition. The solid Si-nuclear magnetic resonance spectrum is one kind of spectrums obtained by nuclear magnetic resonance spectrometry. Specifically, in the invention described in the Patent Document 1, in the solid Si-nuclear magnetic resonance spectrum, it is described a sealing material for the light emitting device capable of coating a thick film which is made possible by including a predetermined amount or more of a D" compound with a peak in a chemical shift within a range of −3 to −40 ppm.

However, the sealing material for the light emitting device described in Patent Documents 1 and 2, there is a problem that the sealing material causes film peeling due to an insufficient adhesiveness when thermal (hot-cold) shock is acted thereon; even high crack resistance is achieved.

The present invention is intended to provide a sealing material for a light emitting device, which is able achieve both the adhesiveness and the crack resistance, have the high sulfurization resistance and the wet heat resistance, and seal the light emitting element.

Means of Solving the Problems

The invention according to Claim 1 is a sealing material for a light emitting device for sealing a light emitting element, wherein in a solid Si-nuclear magnetic resonance spectrum, a peak has a peak top in a chemical shift within a range of −120 ppm or more and −90 ppm or less, and a half width of 5 ppm or more and 12 ppm or less; in the solid Si-nuclear magnetic resonance spectrum, a peak has a peak top in a chemical shift within a range of −80 ppm or more and −40 ppm or less, and a half width of 5 ppm or more and 12 ppm or less; and a silanol content ratio is 11% by weight or more and 30% by weight or less.

The invention according to Claim 2 is the sealing material for a light emitting device according to Claim 1, wherein the sealing material optical element contains inorganic oxide fine particles.

The invention according to Claim 3 is the sealing material for a light emitting device according to Claim 2, wherein the inorganic oxide fine particles are $ZrO_2$.

The invention according to Claim 4 is the sealing material for a light emitting device according to Claim 1, wherein the sealing material contains a cyclic ether compound.

The invention according to Claim 5 is the sealing material for a light emitting device according to Claim 1, wherein the sealing material contains a silane coupling agent.

The invention according to Claim 7 is the light emitting device in which at least a light emitting surface of an light emitting element is covered with a sealing layer, wherein the sealing layer having a film thickness of 10 μm or more and less than 500 μm is formed with the sealing material for the light emitting device according to any one of Claim 1 to Claim 6.

The invention according to Claim 8 is the light emitting device, in which at least a light emitting surface of a light emitting element is covered with a sealing layer, comprising a phosphor-containing resin layer containing a resin and phosphor particles on the sealing layer, wherein the sealing layer is formed with the sealing material for the light emitting device according to any one of Claim 1 to Claim 5, and has a film thickness of 0.7 μm or more and 15 μm or less.

The invention according to Claim 9 is the light emitting device according to Claim 7 or Claim 8, wherein the light emitting element is a light emitting diode.

The invention according to Claim 10 is the production method of a light emitting device in which at least a light emitting surface of a light emitting element is covered with a sealing layer, comprising the steps of applying a sealing agent for the light emitting device onto the light emitting element; and forming a sealing layer containing the sealing material for the light emitting element according to any one of Claim 1 to Claim 6 by curing the sealing agent for the light emitting device at 80° C. or more.

Effects of the Invention

The sealing material for the light emitting device according to the present invention satisfies the following conditions:
in the solid Si-NMR spectrum, a peak has a peak top in a chemical shift within a range of −120 ppm or more and −90 ppm or less (that is, a $Q^n$ peak group), and a half width of 5 ppm or more and 12 ppm or less;
in the solid Si-NMR spectrum, a peak has a peak top in a chemical shift within a range of −80 ppm or more and −40 ppm or less (that is, a $T^n$ peak group), and a half width of 5 ppm or more and 12 ppm or less; and
a silanol content ratio is 11% by weight or more and 30% by weight or less.

Thus, the sealing material for the light emitting device is able to achieve both the adhesiveness and the crack resistance, and obtain the high sulfurization resistance and wet heat resistance.

BRIEF DESCRIPTION OF THE DRAWINGS

FIG. 3A is a table illustrating each condition and evaluation result for examples 1 to 8 and comparative examples 1 to 9.
FIG. 3B is a table illustrating each condition and evaluation result for examples 5 and 9 to 11.
FIG. 3C is a table illustrating each condition and evaluation result for examples 5, 12, and 13.
FIG. 3D is a table illustrating each condition and evaluation result for examples 5, 14, and 15.
FIG. 3E is a table illustrating each condition for examples 16 to 19, and evaluation results.
FIG. 3F is a table illustrating each condition and evaluation result for examples 9, and 20 to 24.

MODES FOR CARRYING OUT THE INVENTION

Figure 1A:
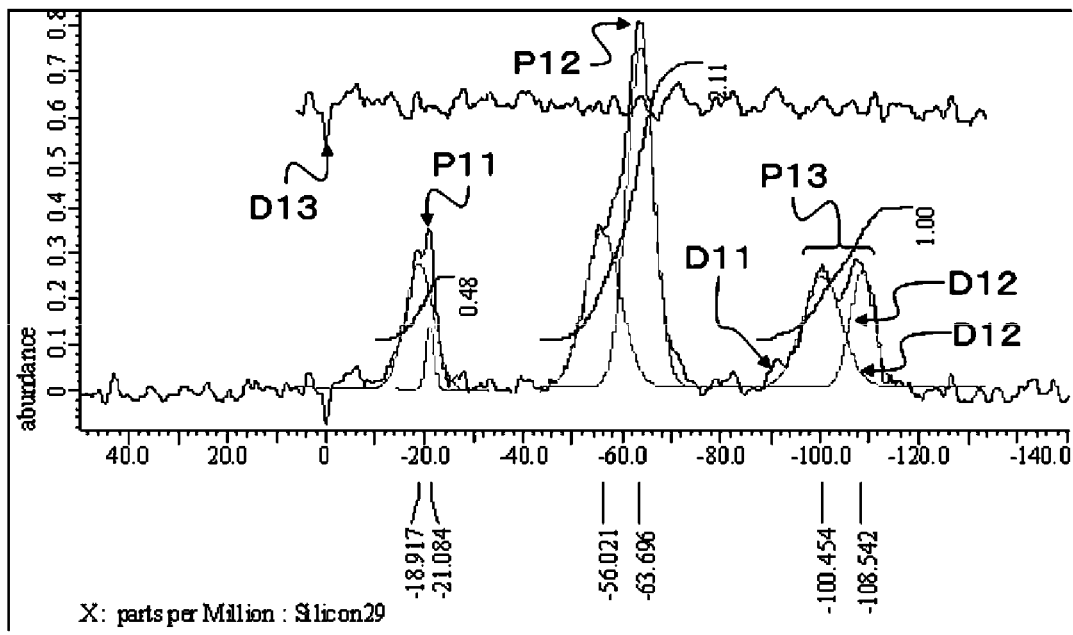
FIG. 1A is an example of measurement results measured with a solid Si-NMR spectrum.

Hereinafter, the present invention is described in detail; however, the invention is not limited to embodiments described below, and can be carried out in various modifications without departing from the scope of the invention.

Before describing the present embodiments, a solid Si-nuclear magnetic resonance (hereinafter, it is called NMR) spectrum is firstly described.

A compound consisting of silicon as its main component is represented by a rational formula of $SiO_2 \cdot nH_2O$ and has a structure in which an oxygen atom O is bound to each vertex of a tetrahedron of a silicon atom Si and a silicon atom Si is further bound to each of these oxygen atoms O to spread like a network. Further, the pattern views illustrated below represent a Si—O network structure without showing the above tetrahedron structure, and some of the oxygen atoms O are substituted by other components (for example, —H, —$CH_3$, or the like) in a repetitive unit of Si—O—Si—O—. When one of the silicon atoms Si is focused, there are a silicon atom Si ($Q^4$) having four —OSi as shown in a pattern view (A), a silicon atom Si ($Q^3$) having three —OSi as shown in a pattern view (B), and the like. Then, in the solid Si-NMR spectrum, peaks based on each of the above silicon atoms Si are in order called a $Q^4$ peak, $Q^3$ peak, and so on.

[Chemical 1]

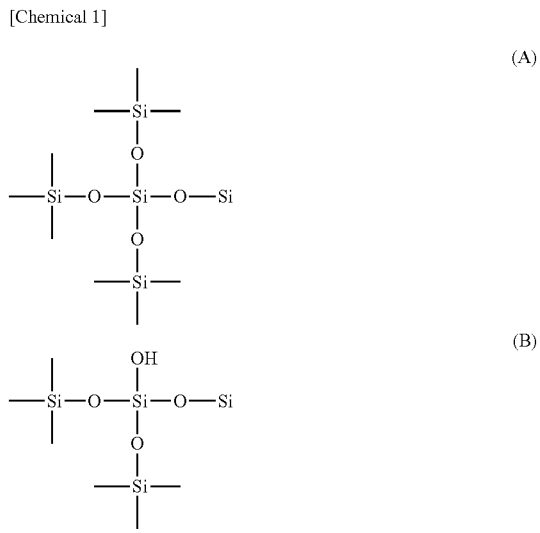

A silicon atom with these four bound oxygen atoms (that is, silicon corresponds to a $Q^n$ compound) is typically called a Q site. In the present specification, peaks $Q^0$ to $Q^4$ originating from the Q site will be called a $Q^n$ peak group. The $Q^n$ peak group of a silica membrane containing no organic substituent is usually observed as a continuous multimodal peak in a region of a chemical shift within a range of −80 to −130 ppm.

In contrast, a silicon atom with three bound oxygen atoms and one other bound atom (normally a carbon atom) (that is, silicon corresponds to a $T^n$ compound) is typically called a T site. In the same way as the Q site, peaks originating from the T site are observed as peaks $T^0$ to $T^3$, respectively. In the specification, peaks originating from the T site will be called a $T^n$ peak group. The $T^n$ peak group is typically observed as a continuous multimodal peak in a region of a higher magnetic field side (usually a chemical shift of −80 to −40 ppm) than the $Q^n$ peak group.

Further, a silicon atom with two bound oxygen atoms and two other bound atoms (normally carbon atoms) (that is, silicon corresponds to a $D^n$ compound) is typically called a D site. In the same way as the peak group originating from the Q site or T site, peaks originating from the D site are observed as peaks ($D^n$ peak group) $D^0$ to $D^n$, respectively, and also observed in a region of a higher magnetic field side (usually a chemical shift within a range of −3 to −40 ppm) than the Q″ or T″ peak group, as a multimodal peak.

Similarly, a silicon atom with one bound oxygen atom and three other bound atoms (normally carbon atoms) is typically called a M site, and the M site is observed as a multimodal peak in a region of the highest magnetic field side (usually the chemical shift of 0 to −3 ppm).

Figure 1B:
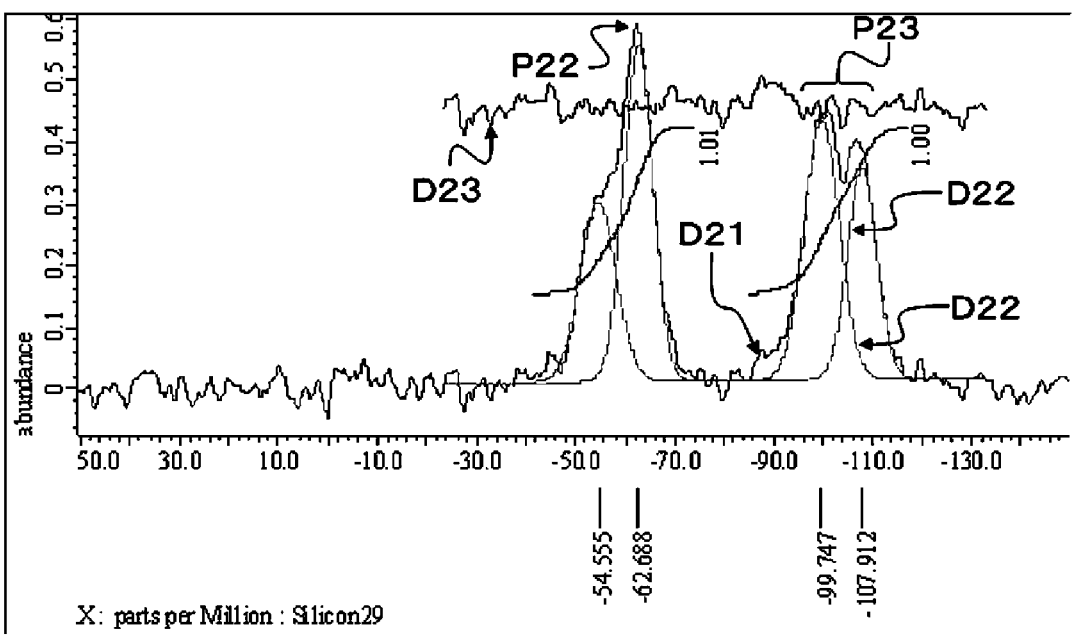
FIG. 1B is an example of measurement results measured with a solid Si-NMR spectrum.

Now, refer to FIG. 1A and FIG. 1B. FIG. 1A and FIG. 1B respectively illustrate an example of the solid Si-NMR spectrum. In FIG. 1A and FIG. 1B, the respective horizontal axis represents the chemical shift, and the respective vertical axis represents "relative intensity" depending on a content of the compound in each structure.

For example, the measurement result illustrated in FIG. 1A is a measurement result subjecting the sealing material for the light emitting device consisting of silicon as its main component representing the presence of each of the D″ peak group, T″ peak group, and Q″ peak group. In FIG. 1A, D11 represents measurement data, and D12 represents data modeled with Gaussian function. In addition, D13 represents a differential spectrum. In the example illustrated in FIG. 1A, peaks P11, P12, and P13 are observed. The peak P11 has a peak top in a vicinity of a chemical shift of −20.0 ppm. That is, it is shown that the peak P11 includes a D″ compound. In this peak P11, the width of a part having a half relative intensity of the peak value (that is, half width) is about 10 ppm. In the case when a plurality of peaks are observed, wave separation (peak separation) of the Si-NMR spectrum is performed by fitting with Gaussian function or Lorentz function, and for each of separated peak, the width of the part having a half relative intensity of the peak value is derived as the half width.

Further, the peak P12 has a peak top in the vicinity of a chemical shift of −60.0 ppm. That is, it is shown that the peak P12 includes a T″ compound. The half width of the peak P12 is about 15 ppm. Furthermore, the peak P13 has a peak top in the vicinity of a chemical shift of −100.0 ppm to −110 ppm. That is, it is shown that the peak P13 includes a Q″ compound. The half width of the peak P13 is about 17 ppm. As described above, the example in FIG. 1A shows that the D″ compound, T″ compound, and Q″ compound are included.

Further, the measurement result illustrated in FIG. 1B is a measurement result subjecting the sealing material for the light emitting device consisting of silicon as its main component representing the presence of each of the T″ peak group, and Q″ peak group. In FIG. 1B, D21 represents measurement data, and D22 represents data optimized with Gaussian function. In addition, D23 represents a differential spectrum. In the example illustrated in FIG. 1B, a peak P22 and a peak 23 are observed. The peak P22 is a peak originating from the T site, and the peak P23 is a peck originating from the Q site. In addition, the half width of the peak P22 is about 15 ppm, and the half width of the peak P23 is about 17 ppm. Since the peak originating from the D site is not detected, it is thus indicated that the example in FIG. 1B includes not the D″ compound but the T″ compound, and the Q″ compound.

A respective area ratio of each of those D″, T″, and Q″ peak groups is the same as a molar ratio of silicon atoms placed in an environment corresponding to each peak group. Therefore, when the area of all peaks is set to a molar quantity of all silicon atoms, a total area of the Q″ peak group, the T″ peak group, the D″ peak group, and a M″ peak group will usually correspond to a molar quantity of all silicon atoms directly bound to carbon atoms corresponding thereto.

Based on the above, hereinafter, the sealing material for a light emitting element according to the invention is described. The sealing material for the light emitting element has the Q″ peak group having the half width of 5 ppm or more and 12 ppm or less, and the T″ peak group having the half width of 5 ppm or more and 12 ppm or less. As described above, the peak top position of the Q″ peak group is observed in the chemical shift within a region of −120 ppm or more and −90 ppm or less. Also, the peak top position of the T″ peak group is observed in the chemical shift within a region of −80 ppm or more and −40 ppm or less. In the case when a plurality of peaks are observed in each group, as described above, the peaks are divided by fitting with Gaussian function or Lorentz function, and conditions are determined for each of the divided peaks. It is preferable that each of the peaks satisfies the above half width condition. The sealing material for the light emitting element according to the invention also satisfies the above conditions, and has a silanol content ratio of 11% by weight or more and 30% by weight or less.

Next, a composition of the sealing material for the light emitting element according to the invention is described.

1. Sealing Agent for Light Emitting Element

A sealing agent for a light emitting element of the invention is used to form a sealing layer for sealing a light emitting element. A cured sealing agent for the light emitting element of the invention may be used as a sealing material for the light emitting element. The cured film (sealing layer) of the sealing agent for the light emitting element of the invention has a good adhesiveness with the light emitting element, and also has a high resistance to a sulfide gas. The cured film is excellent in transparency, light resistance, and heat resistance, even if the film has a thick film, and no crack is generated even if used for a long period of time. It may be considered that a mechanism for obtaining such the characteristics is as follows.

The sealing agent for the light emitting element of the invention includes polysiloxane having a certain degree of crosslinking obtained by polymerizing trifunctional silane compounds and tetrafunctional silane compounds. The tetrafunctional silane compound has many bonding hands, reacts effectively with a metal reflecting layer and OH group contained in a resin portion, and exhibits an excellent adhesiveness in order to form a covalent bonding. Further, the crosslinking density is also increased so that it makes a sulfide gas, water vapor, and the like to be hardly transmitted. As the result, it exhibits an effect for minimizing corrosion and deterioration of the metal reflecting layer, and the like. Further, the trifunctional silane compound provides the sealing agent for the light emitting element with flexibility with organic groups, such as a methyl group, and the like, and has an effect to suppress an occurrence of cracks originating from the high crosslinking density of the tetrafunctional silane compounds.

When the sealing agent for the light emitting element including both of the tetrafunctional silane compounds and trifunctional silane compounds of the invention is applied onto the light emitting element, the tetrafunctional silane compounds having a high reactivity in the vicinity of the light emitting element surface more effective forms the covalent bonding with the OH group on the light emitting element surface than the trifunctional silane compounds, and lays the foundation for leading to the high adhesiveness. Further, the crosslinking density especially in the vicinity of the light emitting element surface becomes higher, and it makes more difficult for the sulfide gas, and water vapor, be transmitted.

An unreacted group of the tetrafunctional silane compounds bounded to the light emitting element surface forms a bound of the both of the rest tetrafunctional silane compounds and the trifunctional silane compounds. As a result, the sealing layer for the light emitting element is formed. The trifunctional silane compounds are more polymerized in a region slightly separated from the interface with the light emitting element because of reactivity thereof, thus provide the sealing layer for the light emitting element with flexibility to hardly generate cracks. Further, the gas barrier properties of the sulfide gas, water vapor, and the like, are also improved since the unreacted tetrafunctional silane compounds advances the crosslinking with the sealing layer for the light emitting element.

As described above, it is considered that the sealing material for the light emitting element achieves both the adhesiveness and the crack resistance resistant to thermal (hot-cold) shock.

Further, in the invention, by using not more than a predetermined amount of bifunctional silane compound components having high flexibility and many organic groups, the sealing material for the light emitting element discoloration derived from light degradation and heat deterioration of the organic groups can be suppressed, and the sealing material can also be used as a sealing material for a high power LED from which a high temperature and high light volume of light is generated.

The sealing agent for the light emitting element of the invention is classified broadly into a case when phosphor particles are not included (refers to a "binder type sealing agent"), and a case when phosphor-containing particles are included (refers to a "phosphor-containing sealing agent").

a. Binder Type Sealing Agent

A binder type sealing agent includes polysiloxane, an organic metal compound, and a solvent, and also included inorganic fine particles, and the like, as needed.

(Polysiloxane)

Polysiloxane is a copolymer which hydrolyzes a silane compound represented by a general formula (I) below or an oligomer thereof to be polycondensed.

$$Si(OR^1)_m Y_{4-m} \quad (I)$$

where, $OR^1$ represents a hydrolyzable group,
Y represents a monovalent organic group, and
m represents any integer from 1 to 4.

In the above general formula (I), $OR^1$ represents a hydrolyzable group. The hydrolyzable group is a group which is hydrolyzed with water in the binder type sealing agent to generate a reactive hydroxyl group. Examples of the hydrolyzable group include a lower alkoxy group having a carbon number of 1 to 5, an acetoxy group, a butanoxime group, a chloro group, and the like. Among those hydrolyzable groups, a kind may be included solely, or two or more kinds may be included therein. Since the hydrolyzable group particularly has a neutralized component that liberates after the reaction, a lower alkoxy groups having a carbon number of 1 to 5 is preferable, and a methoxy group or ethoxy group is more preferable. These groups have good reactivity, and a liberating solvent is a low boiling solvent, and thus easily removable. In the above general formula (I), when $OR^1$ represents an acetoxy group or chloro group, acetic acid and hydrochloric acid are liberated by hydrolysis reaction so that a process for removing acid components after reaction, and the like, may be performed.

Further, in the above general formula (I), Y represents a monovalent organic group. As the monovalent organic group represented by Y, known groups as monovalent organic groups of a so-called silane coupling agent are exemplified. Specifically, the known groups represent an aliphatic group, an alicyclic group, an aromatic group, and an alicyclic aromatic group, having a carbon number of 1 to 1000, preferably 500 or less, more preferably 100 or less, even more preferably 50 or less, and most preferably 6 or less. These groups may have an atom or a group of atoms of O, N, S, or the like, as a linking group. Among those, a methyl group is particularly preferable for a monovalent group represented by Y, considering from an aspect of that the light resistance and the heat resistance of a cured film of the binder type sealing agent can be made superior.

In the above general formula (I), an organic group represented by Y may have a substituent group. The substituent group may be, for example, an atom, such as F, Cl, Br, I, or the like, or an organic functional group, such as a vinyl group, methacryloxy group, acryloxy group, styryl group, mercapto group, epoxy group, epoxycyclohexyl group, glycidoxy group, amino group, cyano group, nitro group, sulfonate group, carboxy group, hydroxy group, acyl group, alkoxy group, imino group, phenyl group, or the like.

In the above general formula (I), m represents integer from 1 to 4. It is a one-functional silane compound when m=1. Similarly, it is a bifunctional silane compound when m=2, it is a trifunctional silane compound when m=3, and it is a tetrafunctional silane compound when m=4. It is necessary that the polysiloxane contained in the sealing agent of the invention contains at least a polymer of a trifunctional silane compound and a tetrafunctional silane compound.

The trifunctional silane compound contains, a compound represented by a following formula (III):

$$Si(OR^1)_3 CH_3 \quad (II)$$

where, $R^1$ represents each independently an alkyl group or phenyl group, and preferably an alkyl group or a phenyl group having a carbon number of 1 to 5. In the above formula, $CH_3$ corresponds to $Y_1$ in the formula (I) ($Y_{4-3}$ in a case m=3). Further, this trifunctional silane compound corresponds to the above-mentioned T″ compound.

Specific examples of the above trifunctional silane compound include methyltrimethoxysilane, methyltriethoxysilane, methyltripropoxysilane, methyltripentyloxysilane, ethylmonomethoxydiethoxysilane, ethyl monomethoxydipropoxysilane, ethylmonomethoxydipentyloxysilane, ethylmonomethoxydiphenyloxysilane, methylmethoxyethoxypropoxysilane, methylmonomethoxymonoethoxymonobutoxysilane, and the like. Among those, methyltrimethoxysilane, and methyltriethoxysilane are preferable, and methyltrimethoxysilane is more preferable.

Among examples of the tetrafunctional silane compound, compounds represented by a following formula (III) are contained.

$$Si(OR^2)_4 \quad (III)$$

where, $R^2$ represents each independently an alkyl group or phenyl group, and preferably an alkyl group or a phenyl group having a carbon number of 1 to 5. This tetrafunctional silane compound corresponds to the above-mentioned Q″ compound. Like the above formula (III), it represents that $Y_{4-4}=Y_0$ dose not include a monovalent organic group in the formula (I).

Specific examples of the tetrafunctional silane compound include tetraalkoxysilane, such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymono-butoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonomethoxymonopropoxysilane, and monomethoxymonoethoxymonopropoxymonobutoxysilane. Among those, tetramethoxysilane and tetraethoxysilane are preferable.

In the solid Si-NMR spectrum, the sealing agent for the light emitting element according to the invention has the Q″ peak group having the half width of 5 ppm or more and 12 ppm or less, and the T″ peak group having the half width of 5 ppm or more and 12 ppm or less. The Q″ peak group is a Q″ compound, that is, a compound originating from the tetrafunctional silane compound, and the T″ peak group is a T″ compound, that is, a compound originating from a trifunctional monomethylsilane compound. Therefore, polysiloxane according to the embodiment polymerizes the above trifunctional monomethylsilane compound and the tetrafunctional silane compound so as to satisfy the above conditions. Specifically, in the solid Si-NMR spectrum, those compounds are polymerized so as to make the molar ratio of silicon corresponding to the Q″ compound to the total silicon is be 25% or more and 60& or less, and the molar ratio of silicon corresponding to the T″ compound is be 25% or more and 60& or less. In addition, in this case, it is desirable that the molar ratio of silicon corresponding to the D″ compound is less than 30%.

In the case that the molar ratio of silicon corresponding to the Q″ compound is smaller than the above range, when forming a wavelength conversion portion with the sealing agent for the light emitting element according to the invention, a covalent bond between the sealing agent for the light emitting element and the light emitting device (for example, a metal reflecting plate and package), which is the object to be coated therewith, is insufficient, thus that adhesiveness resistant to the thermal (hot-cold) shock is not exhibited. Further, the crosslinking density becomes low, and it is not possible to suppress the deterioration of the metal reflection layer caused by a transmission of corrosive gas, or the like. Furthermore, when the molar ratio is larger than above range, the crosslinking density becomes too high to suppress the generation of the cracks.

In the case that the molar ratio of silicon corresponding to the T″ compound is smaller than the above range, the flexibility of the sealing agent for the light emitting element according to the invention becomes insufficient, thereby making difficult to suppress an occurrence of cracks. Further, when the ratio exceeds the above range, the covalent bond between the sealing agent for the light emitting element and the light emitting device, which is the object to be coated therewith, is insufficient, thus that the adhesiveness resistant to the thermal (hot-cold) shock is not exhibited. It is considered that since the T″ compound is a trifunctional compound and, it is possible to form a covalent bond between each part of the light emitting device (for example, the metallic reflecting plate and package) to some extent; however, the covalent bond has no sufficient bounding property as good as that of the tetrafunctional Q″ compound.

Further, in the case that the molar ratio of silicon corresponding to the D″ compound is 30% or more, the crack resistance caused by the flexibility is improved; however, the covalent bond between the sealing agent for the light emitting element and the light emitting device (for example, the metal reflecting plate and package), which is the object to be coated therewith, is insufficient, thus that the adhesiveness resistant to the thermal (hot-cold) shock is not exhibited. Since the D″ compound is a bifunctional compound, the adhesiveness thereof is lower than that of the T″ compound. Further, the crosslinking density derived from the presence of D″ compound becomes lower; it becomes impossible to suppress the deterioration of the metal reflecting layer caused by a transmission of corrosive gas, or the like. Furthermore, the D″ compound has more functional groups of organic origin that change color with heat, thus leading to decrease in the heat resistance.

The sealing material for the light emitting element according to the invention includes at least both of the Q″ compound and the T″ compound within the described range. By using such a composition, it is possible to obtain a sealing material for a light emitting element having excellent adhesion, crack resistance, and gas barrier properties.

The silanol content ratio of the sealing agent for the light emitting element material according to the invention is normally 11% or more and 30% or less, and preferably 20% or more and 25% or less. Silanol content ratio adjustment of the sealing agent material for the light emitting device within the same range is achieved by mixing the tetrafunctional silane compounds and the trifunctional silane compounds at a predetermined ratio, as a monomer, to polymerize. At this time, bifunctional silane compounds may also be mixed therein as long as the silanol content ratio of the sealing material for the light emitting device falls within the range of 11% or more and 30% or less.

Further, the silicon content ratio of the sealing material used for the light emitting layer is preferably 20% by weight or more. A silicone-based sealing agent for the light emitting element formed with a skeleton bonded by a siloxane bond three dimensionally with a high degree of crosslinking is close to minerals, such as glasses or rocks, which are different from conventional sealing materials for the resin-based semiconductor light emitting devices, such as a epoxy resin. Therefore, it is understandable that the sealing material of the invention can be a protective coating film which is rich in the heat resistance and light resistance. Since the silicone-based sealing agent for the light emitting element, particularly the one having a methyl group as a substituent, has no absorption in the ultraviolet region, photolysis is unlikely to occur so that the sealing agent is excellent in the light resistance.

The silicon content ratio of the sealing agent for the light emitting element according to the invention is 20% by weight or more as described above; however, 25% by weight or more is particularly preferable, and 30% by weight or more is more preferable. On the other hand, since the content ratio of silicon of a glass consisting only of $SiO_2$ is 47% by weight, an upper limit of the range is normally 47% by weight or less.

The silicon content ratio of the sealing material for the light emitting element according to the invention can be controlled by selecting an organic monovalent group represented by Y in the descried general formula (I). 20% by weight or more of the silicon content ratio of the sealing agent for the semiconductor light emitting device of the invention can be achieved when that a number of carbons of the monovalent organic group represented by Y is 6 or less. In particular, in view of that the light resistance and heat resistance of the cured film of the binder type sealing agent can be improved, a monovalent group represented by Y is preferably a methyl group among others.

The silicon content ratio of the sealing material for the light emitting element may be determined, for example, based on a result of inductively Coupled Plasma spectrometry (hereinafter, appropriately shorten to "ICP") analysis.

Further, the silanol content ratio of a semiconductor light emitting device member is determined by that, for example, the solid Si-NMR spectrum measurement is performed, a ratio (%) of silicon atoms, which are silanol in the total silicon atoms, is determined by the ratio of the peak area derived from the silanol to the total peak area, and the determined ratio is then compared with the content ratio of the silicon separately analyzed.

As long as the above-mentioned conditions are satisfied, the polymerization ratio of the trifunctional monomethylsilane compounds and the tetrafunctional silane compounds is not particularly limited. In the case that the molar ratio of the tetrafunctional silane compounds is excessive, the crosslinking degree of polysiloxane is increased when the cured film is generated. Accordingly, shrinkage of the cured film is increased so that it became easier for cracks to be generated. Further, in the case that the molar ratio of functional monomethylsilane compounds is excessive, the amount of methyl groups (organic groups) originating from the trifunctional monomethylsilane is increased in the cured film. Thus, the liquid repellency is likely to occur when the binder type sealing agent is being applied. Further, the sulfide gas resistance tends to be decreased as the crosslinking degree of polysiloxane is decreased. The polymerization ratio may be determined in consideration of these features.

The mass average molecular weight of polysiloxane is 1000 to 3000, preferably 1200 to 2700, and more preferably 1500 to 2000. When the mass average molecular weight is less than 1000, the viscosity is low, and liquid repellency, or the like, tend to be generated. On the other hand, when the mass average molecular weight is more than 3000, the viscosity is increased, and a uniform film may be difficult to be formed. Further, embedding properties of the light emitting element may be insufficient. A mass average molecular weight is a value (based on polystyrene) measured by gel permeation chromatography.

Polysiloxane Preparing Method

Polysiloxane is prepared by hydrolyzing the above trifunctional monomethylsilane compounds and tetrafunctional silane compounds in the presence of an acid catalyst, water, an organic solvent, and performing a condensation reaction. The mass average molecular weight of the obtained polysiloxane can be adjusted with reaction conditions (particularly, reaction time), and the like.

In this case, the trifunctional monomethylsilane compounds and tetrafunctional silane compounds may be pre-mixed at the above molar ratio, and polymerized at random. Those compounds may also be block-polymerized, that is, the trifunctional monomethylsilane compounds are polymerized solely to some extent, and the tetrafunctional silane compounds are then polymerized solely to the polymer obtained, and the like.

The acid catalyst to be added when the trifunctional monomethylsilane compounds and the tetrafunctional silane compounds are polymerized may be a compound which hydrolyzes a silane compound in the presence of water, and may be either one of organic acids and inorganic acids.

Examples of the inorganic acid include a sulfuric acid, phosphoric acid, nitric acid, hydrochloric acid, and the like, and among those, a phosphoric acid, and nitric acid are preferable. Further, examples of the organic acid include a formic acid, oxalic acid, fumaric acid, maleic acid, glacial acetic acid, acetic anhydride, propionic acid, carboxylic acid residue, such as n-butyric acid, and a compound having a sulfur-containing acid residue, such as an organic sulphonic acid, and the like. Specific examples of the organic acid include an organic sulphonic acid, an ester compound thereof (organic sulphuric ester, organic sulfurous ester), and the like.

Among those acid catalysts, an organic sulfonic acid represented by the following general formula (IV) is particularly preferred.

$$R^3-SO_3H \qquad (IV)$$

(where, $R^3$ is a hydrocarbon group which may have a substituent group)

The hydrocarbon group represented by $R^3$ in the above formula (IV) may be a linear, branched, or cyclic hydrocarbon group having a carbon number of 1 to 20. The hydrocarbon may be a saturated hydrocarbon, or may be an unsaturated hydrocarbon. The hydrocarbon may also have, for example, halogen atom, such as fluorine atom, or the like, or a substituent group, such as a sulfonate group, carboxyl group, hydroxyl group, amino group, a cyano group, or the like.

Examples of the cyclic hydrocarbon group represented by $R^3$ in the above general formula (IV) include a phenyl group, naphthyl group or anthryl hydrocarbon group, such as an aromatic group, or the like, and particularly preferable a phenyl group. The aromatic hydrocarbon group may have a linear, branched, or cyclic saturated or unsaturated hydrocarbon group having a carbon number of 1 to 20, as a substituent group.

The organic sulfonic acid represented in the above general formula (IV) is preferably nonafluorobutanesulfonic acid, methanesulfonic acid, trifluoromethane sulfonic acid, dodecylbenzenesulfonic acid, or a mixture thereof.

The amount of the acid catalyst to be mixed when the polysiloxane is prepared is preferably an amount in which the acid catalyst concentration in the system to perform the hydrolysis reaction of the silane compound is 1 to 1000 ppm, and more preferably in a range of 5 to 800 ppm.

Further, depending on the amount of water to be mixed when the polysiloxane is prepared, film quality and storage stability of the polysiloxane are changed. Thus, a water addition rate is adjusted according to the film quality, and the like, of interest. Here, the water addition rate is a ratio (%) of the number of moles of water molecules to be added to the number of moles of the alkoxy groups of the silane compound added to the reaction system for preparing the polysiloxane described above.

The above water addition rate is preferably 50 to 200%, and more preferably 75 to 180%. The film quality of the cured film of the binder type sealing agent is stabilized by making the water addition rate be 50% or more. Further, the storage stability of the binder type sealing agent is improved by making the ratio be 200% or less.

Examples of solvents for the polysiloxane preparation include, monohydric alcohols, such as methanol, ethanol, propanol, n-butanol, and the like; alkyl carboxylate, such as methyl-3-methoxy propionate, ethyl-3-ethoxy propionate, and the like; polyhydric alcohols, such as ethylene glycol, diethylene glycol, propylene glycol, glycerol, trimethylolpropane, hexane triol, and the like; monoethers of polyhydric alcohols, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether; diethylene glycol monopropyl ether, diethylene glycol monobutyl ether, propylene glycol monomethyl ether, propylene glycol monoethyl ether, propylene glycol monopropyl ether, propylene glycol monobutyl ether, or monoacetates thereof; esters, such as methyl acetate, ethyl acetate, butyl acetate, and the like; ketones, such as acetone, methyl ethyl ketone, methyl isoamyl ketone, and the like; polyhydric alcohol ethers in which all of the hydroxyl groups of the polyhydric alcohol is alkyletherized such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, diethylene glycol methyl ethyl ether, and the like; and the like. These may be added solely, or in combination of two or more thereof.

(Organic Metal Compounds)

The binder-type sealing agent may include an organic metal compound of a metal alkoxide containing a group 4 or group 13 metal element or a metal chelate. As described above, a metal in the organic metal compound forms polysiloxane, a hydroxyl group of each member of a light emitting element, and metalloxane bonds. Further, in the cured film of the binder type sealing agent, a portion of the organic metal compound forms nano-sized clusters consisting of siloxane bonds.

The organic metal compound is preferably a compound represented by the following general formula (V).

$$M^{m+}X_nY_{m-n} \quad\quad (V)$$

where, M represents a group 4 or group 13 metal element, m represents a valence of M, and which is 3 or 4, and n represents a number of X groups, and which is an integer of 2 or more and 4 or less wherein m≥n.

The metal element represented by M in the general formula (V) is preferably aluminum, zirconium or titanium, and particularly preferably zirconium. A metal chelate or metal alkoxide of zirconium has no absorption wavelength (blue light (wavelength of 420 nm to 485 nm) in particular) in an emission wavelength region of the light emitting element in general. Therefore, the cured film containing the zirconium-based metal element transmits the light emitted from the light emitting element without absorbing the light, and light extraction efficiency of the film is therefore improved.

Further, in the general formula (V), X represents a hydrolyzable group. The hydrolyzable group is a group which is hydrolyzed with water in the binder type sealing agent to generate a hydroxyl group having a good reactivity. Examples of the hydrolyzable group include a lower alkoxy group, acetoxy group, butanoxime group, chloro group, and the like, having a carbon number of 1 to 5. Among those hydrolyzable groups, a kind may be included solely, or a combination of two or more kinds may be contained. Since the hydrolyzable groups particularly have a neutralized component that liberate after the reaction, a lower alkoxy group having a carbon number of 1 to 5 is preferable, and a methoxy group or ethoxy group is more preferable. These groups have a good reactivity, and a liberating solvent is a low boiling solvent, and thus easily removable. In the above general formula (V), when X represents an acetoxy group or chloro group, acetic acid and hydrochloric acid are liberated by hydrolysis reaction so that a process to remove acid components after reaction may be performed.

Further, in the above general formula (V), Y represents a monovalent organic group. As the monovalent organic group represented by Y, known groups as monovalent organic groups of a so-called silane coupling agent are exemplified. Specifically, the known groups represent an aliphatic group, an alicyclic group, an aromatic group, and an alicyclic aromatic group, having a carbon number of 1 to 1000, preferably 500 or less, more preferably 100 or less, even more preferably 50 or less, and particularly preferably 6 or less. These groups may have an atom or a group of atoms of O, N, S, or the like, as a linking group. Among those, a methyl group is particularly preferable for a monovalent group represented by Y, considering from an aspect of that the light resistance and heat resistance of the cured film of the binder type sealing agent can be made superior.

The organic group represented by Y in the general formula (V) may have a substituent group. The substituent group may be, for example, an atom, such as F, Cl, Br, I, or the like, or an organic functional group, such as a vinyl group, methacryloxy group, acryloxy group, styryl group, mercapto group, epoxy group, epoxycyclohexyl group, glycidoxy group, amino group, cyano group, nitro group, sulfonate group, carboxy group, hydroxy group, acyl group, alkoxy group, imino group, phenyl group, or the like.

Specific examples of the organic metal compound represented by the above general formula (V) include the following compounds. Examples of metal chelate or metal alkoxide containing aluminum elements include aluminum tri-isopropoxide, aluminum tri-n-butoxide, aluminum tri-t-butoxide, aluminum triethoxide, and the like.

Examples of metal chelate or metal alkoxide containing zirconium elements include zirconium tetramethoxide, zirconium tetra-ethoxide, zirconium tetra-n-propoxide, zirconium tetra-i-propoxide, zirconium tetra-n-butoxide, zirconium tetra-i-butoxide, zirconium tetra t-butoxide, zirconium dimethacrylate dibutoxide, dibutoxy zirconium bis (ethyl acetoacetate), and the like.

Examples of metal chelate or metal alkoxide containing titanium elements include titanium tetraisopropoxide, titanium tetra-n-butoxide, titanium tetra-i-butoxide, titanium methacrylate triisopropoxide, titanium tetra methoxypropoxide, titanium tetra-n-propoxide, titanium tetra-ethoxide, titanium lactate, titanium bis (ethylhexoxy) bis(2-ethyl-3-hydroxyhexoxide), titanium acetylacetonate, and the like.

However, compounds exemplified above are some of the organic metal compounds which are easily available in the market, and the coupling agents mentioned in Chapter 9 of "Optimal application technology of coupling agent" published by Science and Technology Research Institute as well as the compounds listed in the relevant product lists may also be applied to the invention as the above-mentioned organic metal compounds.

It is preferable that 5 to 100 parts by mass of the above organic metal compound is added, more preferable that 8 to 40 parts by mass is added, and more preferable that 10 to 15 parts by mass is added, based on 100 parts by mass of the above-mentioned polysiloxane. In the case that the adding amount is less than 5 parts by mass, an addition effect of the organic metal compound is not obtained. On the other hand, in the case that the adding amount is more than 100 parts by mass, the storage stability of the binder type sealing agent is decreased.

(Solvent)

The binder type sealing agent includes a solvent. The solvent may be an aqueous solvent combining water with an organic solvent having an excellent compatibility with water, or a non-aqueous solvent which is an organic solvent having a low compatibility with water, and contains no water. Examples of the organic solvent having the excellent compatibility with water include alcohols, such as methanol, ethanol, propanol, butanol, or the like.

The binder type sealing agent of the invention preferably contains an aqueous solvent, that is, water in particular. The amount of water contained in the binder type sealing agent is preferably 10 to 120 parts by mass, more preferably 80 to 100 parts by mass, based on 100 parts by mass of the above-mentioned polysiloxane. When 10 parts by mass or more of water is contained based on 100 parts by mass of the above-mentioned polysiloxane, the polysiloxane can be sufficiently hydrolyzed so that the wet heat resistance, and the like, of the cured film become sufficient. On the other hand, when more than 120 parts by mass of water is contained based on 100 parts by mass of the above-mentioned polysiloxane, the hydrolysis reaction, or the like, may occur during storage of binder type sealing agent.

The solvent of the binder type sealing agent also preferably contains an organic solvent having a boiling point of 150° C. or more, such as ethylene glycol, propylene glycol, or the like. When an organic solvent having a boiling point of 150° C. or more is contained, the storage stability of the binder type sealing agent is improved. Also, when the organic solvent having a boiling point of 150° C. or more is contained, the solvent can be easily discharged from the discharge opening of a discharge device during the application of the binder type sealing agent. On the other hand, the boiling point of the solvent is preferably 250° C. or less. By using such the solvent, good drying properties of the binder type sealing agent can be obtained.

(Inorganic Fine Particles)

Inorganic fine particles may be contained in the binder type sealing agent. A thickening effect of the binder type sealing agent can be obtained by containing the inorganic fine particles. Further, the strength of the cured film of the binder type sealing agent is improved. Furthermore, by containing the inorganic fine particles each having a high refractive index, the light extraction efficiency of the cured film of the binder type sealing agent is enhanced.

Examples of the inorganic fine particles include zirconium oxide, silicon oxide, titanium oxide, oxide fine particles (that is, inorganic oxide fine particles), such as zinc oxide, and the like, and fluoride fine particles, such as magnesium fluoride, and the like.

The average particle diameter of the inorganic fine particles is preferably 1 nm or more and 50 μm or less, considering the each effect described above. The average particle diameter of the inorganic fine particles is, for example, measured by Coulter counter method.

Further, the inorganic fine particles are preferably porous, and the specific surface area thereof are preferably 200 m$^2$/g or more. When the inorganic fine particles are porous, a solvent enters voids of the porous so that the viscosity of the binder type sealing agent is effectively increased. However, the viscosity of the binder type sealing agent is not simply determined by the amount of porous inorganic fine particles but varies according to a ratio of the inorganic fine particles and the solvent, the amount of other components, and the like.

The amount of inorganic fine particles in the binder type sealing agent is such that the amount of the inorganic fine particles in a cured product of the binder type sealing agent is preferably 0.5% by mass or more and 50% by mass or less, and more preferably 1 to 40% by mass. When the amount of the inorganic fine particles is less than 0.5% by mass, the above-mentioned thickening effect and strength improving effects of the cured film can not be obtained. Further, when the amount is more than 50% by mass, the strength of the cured film of the binder type sealing agent is decreased.

The surface of the inorganic fine particles may be treated with a silane coupling agent, or a titanium coupling agent. The compatibility of the inorganic fine particles with polysiloxane and a solvent is increased by performing the surface treatment.

(Physical Properties of Binder Type Sealing Agent)

The pH of the binder type sealing agent is preferably 1 to 4. When the pH is less than 1 or more than 4, a precipitate resulted from a reaction of polysiloxane or organic metal compounds may be generated during storage. In order to adjust the pH value of the binder type sealing agent, for example, nitric acid, pH regulators, or the like, may be added, as needed.

The viscosity of the binder type sealing agent is preferably 10 to 1000 cP, more preferably 12 to 800 cP, even more preferably 20 to 600 cP. When the viscosity of the binder type sealing agent is too low, during the application of the binder type sealing agent, the binder type sealing agent flows away and the application of a sealing layer in the region of interest can not be achieved. Further, when the viscosity of the binder type sealing agent is too high, it is possible that the application of the binder type sealing agent becomes difficult, and further, embedding properties of the light emitting element become insufficient. The viscosity can be adjusted by the amount of the above-mentioned inorganic fine particles, or the like.

(Preparation Method of the Binder Type Sealing Agent)

The binder type sealing agent is prepared by mixing polysiloxane, organic metallic compounds, and optionally, inorganic fine particles, and the like, in a solvent. Stirring of the mixture can be carried out with an arbitrary method, such as, for example, an agitation mill, a kneading blade stirring device, a thin-film revolution type stirring machine, or the like.

(Use of Binder Type Sealing Agent)

Figure 2A:
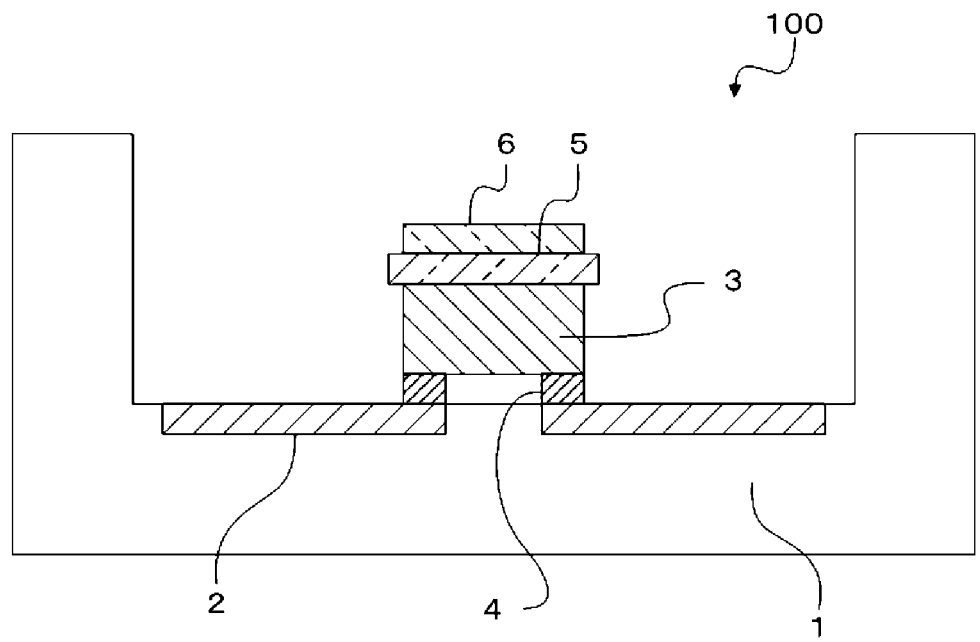
FIG. 2A is a schematic cross-sectional diagram illustrating the configuration of a first light emitting device.
Figure 2B:
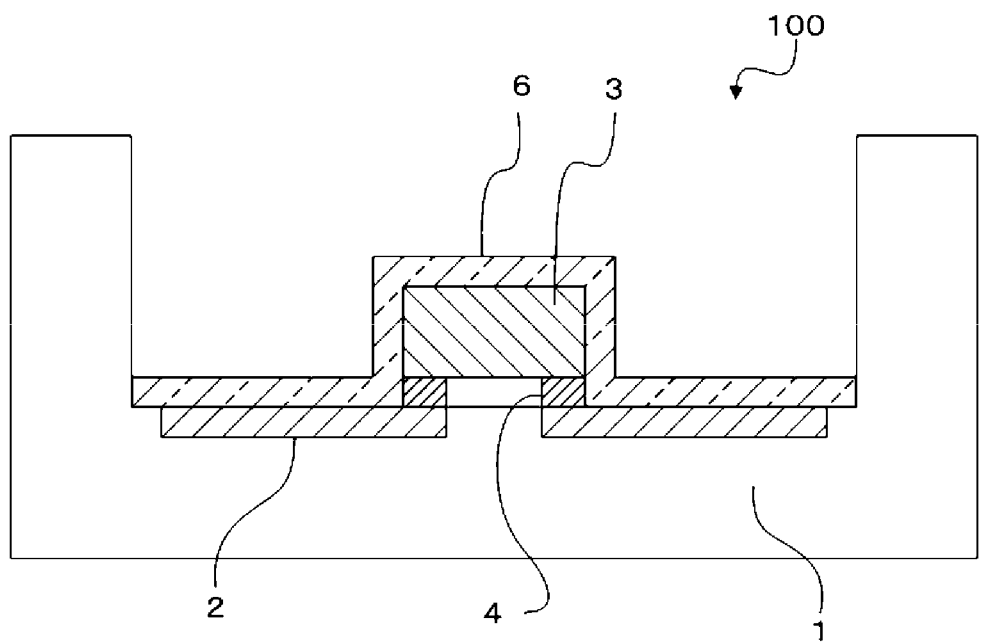
FIG. 2B is a schematic cross-sectional diagram illustrating the configuration of a second light emitting device.
Figure 2C:
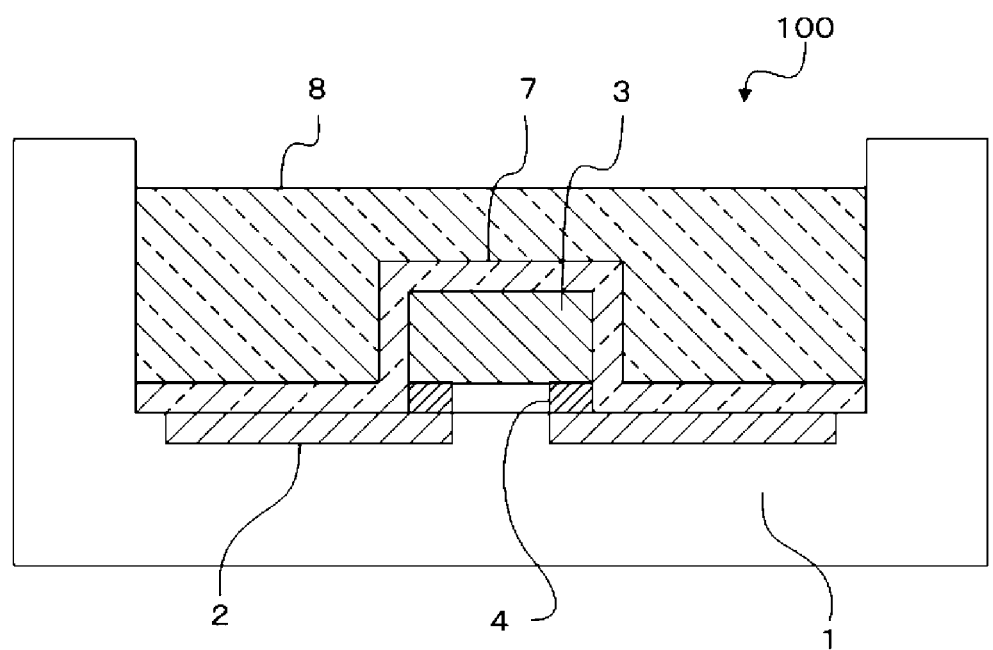
FIG. 2C is a schematic cross-sectional diagram illustrating the configuration of a third light emitting device.

The binder type sealing agent is used, for example, for forming a sealing layer 7 for an LED device 100, illustrated in the schematic cross-sectional diagram of FIG. 2C. The LED device 100 in the above configuration includes, on the sealing layer 7, a phosphor-containing resin layer 8 for converting the wavelength of the light emitted from a LED chip 3. In the LED device 100, the sealing layer 7 carries a function for sealing package 1, metal parts 2, the LED chip 3, and the like, of the light emitting element. The sealing layer 7 is formed by applying the binder type sealing agent so as to cover the package 1, the metal parts 2, the LED chip 3, and the like, of the light emitting element, and then drying and curing the agent.

The binder type sealing agent is also used, for example, for forming a sealing layer 6 of the LED device 100, illustrated in the schematic cross-sectional diagram of FIG. 2A. In the LED device, the sealing layer 6 carries not only the sealing function of the LED chip 3, the metal parts 2, and the like, but also a wavelength conversion function for converting the wavelength of the light emitted from the LED chip 3.

The sealing layer 6 in the LED device 100 can be formed by arranging phosphor particles on the package 1, the metal parts 2, and a glass substrate 5 to protect the LED chip 3 in advance, applying the binder type sealing agent on the phosphor particles, and then drying and curing the agent. That is, the sealing layer 6 containing phosphor-containing particles in the layer is formed with the above forming method.

b. Phosphor (Flourscent Material)-Containing Sealing Agent

In the phosphor-containing sealing agent, polysiloxane, organic metal compounds, a solvent, and phosphor particles are contained, and tabular grains, inorganic particles, and the like, are contained, as needed.

(Polysiloxane)

The polysiloxane contained in the phosphor-containing sealing agent may be the same as the polysiloxane contained in the above binder type sealing agent. The amount of the polysiloxane contained in the phosphor-containing sealing agent is such that the amount of the polysiloxane in the cured product of the phosphor-containing sealing agent is preferably 3% by mass or more and 35% by mass or less, and more preferably 10% by mass or more and 30% by mass or less.

Since the polysiloxane acts as a binder in the cured product of the phosphor-containing sealing agent, when the amount of binder is less than 3% by mass, a cured film having a sufficient film strength is not obtained. On the other hand, when the amount of polysiloxane is more than 35% by mass, the contents of the phosphor particles, the tabular grains, and the like, are relatively reduced so that the viscosity of the phosphor-containing sealing agent tends to be decreased.

(Organic Metal Compounds)

Organic metal compounds contained in the phosphor-containing sealing agent may be the same as the organic metal compounds contained in the above binder type sealing agent. Further, the amount of the organic metal compounds to the amount of the polysiloxane may also be the same as that of the binder type sealing agent.

(Solvent)

The solvent contained in the phosphor-containing sealing agent may be either one of an aqueous solvent combining water with an organic solvent having excellent compatibility with water, and a non-aqueous solvent which is an organic solvent having a low compatibility with water, and contains no water. However, when degradation of the phosphor particles contained in the phosphor-containing sealing agent is easily deteriorated by water, a non-aqueous solvent is preferably used.

On the other hand, when the degradation (deterioration) of the phosphor particles contained in the phosphor-containing sealing agent by water is small, the aqueous solvent is preferable as described above. Hydrolysis of the polysiloxane is promoted by containing water. Further, it is possible for the tabular grains, fluoride particles, and the like, to be swollen, the viscosity of the phosphor-containing sealing agent is increased. There is a possibility that swelling of the tabular grains, and the like, is inhibited when impurities are contained in water. Therefore, the water contained in the phosphor-containing sealing agent is desirably free of impurities.

(Phosphor Particles)

Phosphor particles may be particles which are excited by the wavelength (exciting wavelength) of the light emitted from the light emitting element (LED chip), and emit fluorescent light having a wavelength different from the exciting wavelength. For example, when the blue light is emitted from the LED chip, since the phosphor particles emitting yellow fluorescence are contained therein, a white LED element is obtained. Examples of the phosphor particles that emit yellow fluorescence include YAG (yttrium aluminum garnet) phosphor. The YAG phosphor can convert blue light emitted from the blue LED element (wavelength 420 nm to 485 nm) into yellow light (wavelength of 550 nm to 650 nm).

The phosphor particles can be produced by, for example, 1) mixing an appropriate amount of fluoride, such as ammonium fluoride, or the like, as a flux, with a mixed raw material having a predetermined composition, and pressing the mixture to form a molded body, and 2) placing the resulting body to a crucible to bake at a temperature range of 1350 to 1450° C. in air for 2 to 5 hours to obtain a sintered body.

The mixed raw material having a predetermined composition may be obtained by sufficiently mixing, oxides of Y, Gd, Ce, Sm, Al, La, and Ga with the compounds to be the oxides easily at a high temperature, in a stoichiometric ratio. Alternatively, the mixed raw material having a predetermined composition may obtain a solvent in which the rare earth elements of Y, Gd, Ce, and Sm are dissolved in an acid in a stoichiometric ratio by mixing a co-precipitated oxide obtained by co-precipitating with oxalic acid, aluminum oxide, and gallium oxide.

The type of the phosphor is not limited to the YAG phosphor, and can be a non-garnet phosphor containing no Ce, or the like, or other phosphor, for example.

The average particle diameter of the phosphor particles is preferably 1 μm or more and 50 μm or less, and more preferably 10 μm or less. The larger particle diameter of the phosphor particles is, the higher the light emitting effect (wavelength conversion efficiency) becomes. On the other hand, when the particle diameter of the phosphor particles is too large, gaps generated on the interface between the phosphor particles and polysiloxane, or the like, become large. Thus, the strength of the cured film of the phosphor-containing sealing layer is decreased. The average particle diameter of the inorganic fine particles may be, for example, measured by Coulter counter method.

The amount of the phosphor particles contained in the phosphor-containing sealing agent is such that the amount of phosphor particles in the cured film of the phosphor-containing sealing agent is preferably 60 to 95% by mass. Basically, the concentration of the phosphor particles in the cured film of the phosphor-containing sealing agent is preferably as high as possible. When the concentration of the phosphor particles is too high, the content ratio of the binder is reduced so that the distribution of the phosphor particles in the cured film tends to be uniform. Further, it is possible to arrange a required amount of the phosphor particles in the LED device even the cured film is thin, when the concentration of the phosphor particles is high.

Further, when the concentration of the phosphor particles in the cured film of the phosphor-containing sealing agent is high, the phosphor particles are mutually in close contact so that the strength of the cured film of the phosphor-containing sealing agent is increased. Furthermore, when the concentration of the phosphor particles in the cured film is high, heat generated from the phosphor particles is easily dissipated from the cured film.

On the other hand, when the concentration of phosphor particles in the cured film of the phosphor-containing sealing agent is too high (greater than 95% by mass), the content ratio of the binder may be severely degraded, and the phosphor particles may not be bounded to each other.

The concentration of the phosphor particles in the cured film can be obtained from the phosphor particles amount to be added to the phosphor-containing sealing agent.

(Tabular Grains)

The phosphor-containing sealing agent may contain the phosphor particles along with tabular grains. When the tabular grains are contained in the phosphor-containing sealing agent, the viscosity of the phosphor-containing sealing agent is increased, and sedimentation of the phosphor particles in the sealing agent is suppressed. The tabular grains are present as a card-house structure in the phosphor-containing sealing agent, and the viscosity of the sealing agent is significantly increased with a small amount.

Typical examples of the tabular grains contained in the phosphor-containing sealing agent include layered clay mineral fine particles. The main component of the layered clay mineral fine particles is a layered silicate mineral, a swelling clay mineral having a structure, such as a mica structure, kaolinite structure, smectite structure, and the like, is preferable, and a swelling clay mineral having a smectite structure rich in swelling is more preferable. In order to exhibit tabular-shape, the layered clay mineral fine particles can improve the film strength of the layer constituting the phosphor-containing sealing.

The content of the tabular grains is such that the amount of the tabular grains in the cured film of the phosphor-containing sealing agent is preferably 0.5% by mass or more and 20% by mass or less, and more preferably 0.5% by mass or more and 10% by mass or less. When the content of the tabular grains in the cured film is less than 0.5% by mass, the addition effect of the tabular grains can not be sufficiently obtained. On the other hand, when the content of the layered silicate mineral is more than 20% by mass, the strength of the phosphor-containing sealing agent is decreased.

In the tabular particles, considering the compatibility with the solvent, the surface of the layered clay mineral fine particles may be modified (surface treated) with ammonium salt, or the like.

(Inorganic Particles)

The phosphor-containing sealing agent may contain inorganic fine particles. Since the inorganic fine particles are contained, the inorganic fine particles enter the gaps between the phosphor to increase the strength of the cured film of the phosphor-containing sealing agent. Further, when the inorganic fine particles are porous, a solvent enters porous void portions, and thus, the viscosity of the phosphor-containing sealing agent is increased effectively. A specific surface area of the inorganic fine particles is preferably 200 m²/g or more.

Examples of the inorganic fine particles include zirconium oxide, silicon oxide, titanium oxide, oxide fine particles, such as zinc oxide, or the like, and fluoride fine particles, such as magnesium fluoride, or the like.

The average particle diameter of the inorganic fine particles contained in the phosphor-containing sealing agent is preferably 1 nm or more and 50 μm or less, more preferably 1 nm or more and 10 μm or less, and further more preferably 1 to 100 nm, considering the each effect described above. The average particle diameter of the inorganic fine particles is, for example, measured by Coulter counter method.

The amount of inorganic fine particles contained in the phosphor-containing sealing agent is such that the amount of the inorganic fine particles in the cured product of the phosphor-containing sealing agent is preferably 0.5% by mass or more and 50% by mass or less, and more preferably 1 to 40% by mass. When the amount of the inorganic fine particles is less than 0.5% by mass, gaps between the phosphor particles can not be filled with the inorganic fine particles so that the thickening effect and the film strength improving effects described above can not be obtained. Further, when the amount of the inorganic fine particles is less than 0.5% by weight, phosphor particle components are relatively increased so that handling performance during the application of the phosphor-containing sealing agent is reduced. Therefore, forming a layer having uniform chromaticity becomes difficult. On the other hand, when the amount of the inorganic fine particles is more than 50% by mass, the inorganic fine particles scatter the exciting light of the light emitting element excessively, and thus reducing the light extraction efficiency of the light emitting device.

The surface of the inorganic fine particles may be treated with a silane coupling agent or a titanium coupling agent. The compatible of the inorganic fine particles with polysiloxane or a solvent is increased by the surface treatment.

(Cyclic Ether Compound)

The sealing agent for the light emitting device may contain a cyclic ether compound. Rings of the cyclic ether compound can capture metal ions, and the like. Therefore, it is possible to capture the metal ions flowing out from the metal reflecting plate, or the like, of the light emitting device under a wet heat environment, and to prevent corrosion caused by migration of the metal.

The cyclic ether compound contained in the sealing agent for the light emitting device can be a cyclic compound represented by a formula (VI).

$$(-CH_2-CH_2-Z-)_n \qquad (VI)$$

In the general formula (VI), it is collectively called crown ether when Z is oxygen "O", azacrown ether when Z is a nitrogen compound "N—R", and thiacrown ethers when Z is sulfur "S". Here, n represents an integer of 1 or more. Further, R represents hydrogen "H" or an alkylene group having a carbon number of 1 to 1000.

Further, the cyclic ether compound may contain, as represented by a formula (VII), a benzene ring, or the like.

[Chemical 2]

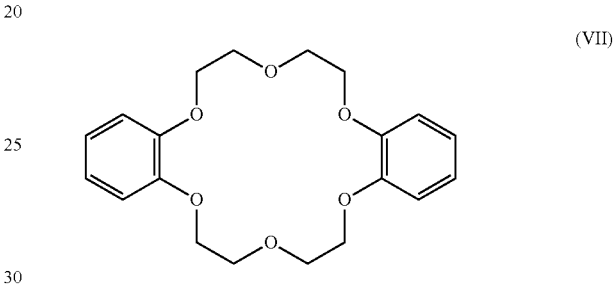

(VII)

As specific examples of the cyclic ether compound, 12-crown-4, 15-crown-5, 18-crown-6, 21-crown-7, dibenzo-18-crown-6, diaza-18-crown-6, and the like, are exemplified.

Further, the ring is preferably from a 15-membered ring to a 21-membered ring, and more preferably a 18-membered ring.

The content of the cyclic ether compound is preferably 0.1 to 5.0% by mass, more preferably 0.5 to 3.0% by mass, and further more preferably 1.0 to 2.0% by mass, based on the total solid content of the sealing agent for the light emitting device. When the cyclic ether compound is contained more than 1.0% by mass, the wet heat resistance of the cured film of the sealing agent for the light emitting device tend to be increased.

(Silane Coupling Agent)

The sealing agent for the light emitting device may contain a silane coupling agent. Hydroxyl groups exhibited by hydrolyzing a silane coupling agent perform dehydration condensation reaction with the hydroxyl groups present on the surface of the light emitting element, and then form siloxane bonds. Further, the hydroxyl groups also perform the reaction with polysiloxane (first polysiloxane and second polysiloxane) to form siloxane bonds. Thus, when the silane coupling agent is contained in the sealing agent for the light emitting device, as a result of adhesion between the cured product of the sealing agent for the light emitting device and the light emitting element being further enhanced, the wet heat resistance is improved since the contact between water vapor, and the like, and the light emitting device is inhibited.

The silane coupling agent contained in the sealing agent for the light emitting device may be a compound represented by the following formula (VIII).

[Chemical 3]

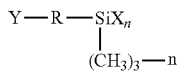
(VIII)

In the general formula (VIII), Y represents a divalent organic group, X represents a hydrolyzable group, and R represents an alkylene group. In addition, n represents any integer of 1 to 3.

In the general formula (VIII), a divalent organic group represented by Y may be an aliphatic group, an alicyclic group, an aromatic group, or an alicyclic aromatic group, having a carbon number of 1 to 1000, preferably 500 or less, more preferably 100 or less, even more preferably 50 or less, and most preferably 6 or less. These groups may have an atom or a group of atoms of O, N, S, or the like, as a linking group.

Y in the above general formula (VIII) may have a substituent group. The substituent group may be, for example, an atom, such as F, Cl, Br, I, or the like, or an organic functional group including a vinyl group, methacryloxy group, acryloxy group, styryl group, mercapto group, epoxy group, epoxycyclohexyl group, glycidoxy group, amino group, cyano group, nitro group, sulfonate group, carboxy group, hydroxy group, acyl group, alkoxy group, imino group, phenyl group, and the like.

In the general formula (VIII), X represents a hydrolyzable group. Examples of the hydrolyzable group include a lower alkoxy group, acetoxy group, butanoxime group, chloro group, and the like, having a carbon number of 1 to 5. Among those hydrolyzable groups, a kind may be included solely, or a combination of two or more kinds may be included. Since the hydrolyzable groups particularly have a neutralized component that liberate after the reaction, a lower alkoxy group having a carbon number of 1 to 5 is preferable, and a methoxy group or ethoxy group is more preferable.

In the general formula (VIII), an alkylene group represented by R is an aliphatic group having a carbon number of 1 to 1000, preferably 500 or less, more preferably 100 or less, further more preferably 50 or less, and particularly preferably 6 or less, and the group may have an atom or a group of atoms of O, N, S, or the like, as a linking group.

Specific examples of the silane coupling agent include vinyltrichlorosilane, vinyltrimethoxysilane, vinyltriethoxysilane, vinyl tris(β-methoxyethoxy)silane, β-(3,4-epoxycyclohexyl)ethyltrimethoxysilane, γ-glycidoxypropyltrimethoxysilane, γ-glycidoxypropyltriethoxysilane, γ-methacryloxypropylmethyldiethoxysilane, γ-methacryloxypropyltrimethoxysilane, γ-methacryloxypropylmethyldiethoxysilane, γ-methacryloxypropyltriethoxysilane, N-β-(aminoethyl)γ-aminopropylmethyldiethoxysilane, N-β-(aminoethyl)γ-aminopropyltrimethoxysilane, N-β-(aminoethyl)γ-aminopropyltriethoxysilane, γ-aminopropyltrimethoxysilane, γ-aminopropyltriethoxysilane, N-phenyl-γ-aminopropyl-aminopropyltrimethoxysilane, γ-chloropropylmethoxysilane, γ-mercaptopropyltrimethoxysilane, γ-mercaptopropylmethyldiethoxysilane, 3-trihydroxysilylmethylphosphonate sodium salt, nitrilotris(methylene)triphosphonic acid, tris(trimethylsilyl)phosphate, tris(trimethylsilyl)phosphate, diethylphosphateethyltriethoxysilane, and the like.

The content of the silane coupling agent is preferably 0.1 to 5.0% by mass to the total solid content of the sealing agent for the light emitting device, and more preferably 0.15 to 2.0% by mass, and even more preferably 0.2 to 1.0% by mass. When 1.0% by mass or more of the silane coupling agent is contained, the wet heat resistance of the cured film of the sealing agent for the light emitting device tends to be higher.

(Physical Properties of the Phosphor-Containing Sealing Agent)

The pH of the phosphor-containing sealing agent is preferably 1 to 4. When the pH is less than 1 or more than 4, a precipitate resulted from a reaction of polysiloxane or organic metal compounds may be generated during storage. In order to adjust the pH value of the phosphor-containing sealing agent, for example, nitric acid, pH regulators, or the like, may be added, as needed.

The viscosity of the phosphor-containing sealing agent is preferably 10 to 1000 cP, more preferably 12 to 800 cP, even more preferably 20 to 600 cP. When the viscosity of the phosphor-containing sealing agent is too low, during the application of the phosphor-containing sealing agent, the phosphor-containing sealing agent flows away and the application of a sealing layer in the region of interest can not be achieved. Further, when the viscosity of the phosphor-containing sealing agent is too high, it is possible that the application of the phosphor-containing sealing agent becomes difficult, and embedding properties of the light emitting element become insufficient. The viscosity can be adjusted by the amount of the above-mentioned inorganic fine particles, or the like.

(Preparation Method of the Phosphor-Containing Sealing Agent)

The phosphor-containing sealing agent is prepared by mixing phosphor particles, polysiloxane, organic metallic compounds, and optionally, inorganic fine particles, tabular grains, and the like, in a solvent.

The mixing order of each component is not particularly limited; however, when water is a portion of the solvent, the following two modes are exemplified: 1) tabular grains (which have been surface-treated to have an oleophilic property) are pre-mixed in a dispersion solvent other than water, and then polysiloxane, organic metal compounds, phosphor particles, inorganic fine particles, and water are added thereto, mixed, and stirred the mixture; and 2) tabular grains (which have been surface-treated to have an oleophilic property) are pre-mixed with water, and then polysiloxane, organic metal compounds, phosphor particles, and inorganic oxide particles are stirred with a dispersion solvent other than water. In this way, the tabular grains are uniformly dispersed in the phosphor-containing sealing agent so that the viscosity can be further increased.

Stirring of the mixture can be carried out with, for example, an agitation mill, a kneading blade stirring device, a thin-film revolution type stirring machine, or the like. It is possible to inhibit sedimentation of the phosphor particles in the phosphor dispersion by adjusting the stirring conditions.

(Use of Phosphor-Containing Sealing Agent)

The phosphor-containing sealing agent is used, for example, for forming the sealing layer 6 of the LED device 100 illustrated in the schematic cross-sectional diagram of FIG. 2. In the LED device, the sealing layer 6 carries not only the sealing function of the LED chip 3, the metal parts 2, and the like, but also the wavelength conversion function for converting the wavelength of the light emitted from the LED chip 3. The sealing layer 6 can be formed by applying the phosphor-containing sealing agent so as to cover the package 1, the metal parts 2, the glass substrate 5 to protect the LED chip 3, and the like, and then drying and curing the agent.

2. Light Emitting Device

The light emitting device of the invention includes a light emitting element, and a sealing layer made from a cured film of the above described sealing agent for the light emitting element. As the light emitting device, a light emitting device having three configurations described below is considered; however, the invention is not limited thereto.
(First Light Emitting Device)

A first light emitting device includes, for example, a light emitting element illustrated in the schematic cross-sectional diagram of FIG. 2A, and a sealing layer to cover the element. The light emitting element in the first light emitting device includes, for example, a package (LED substrate) 1, metal parts (metal wirings) 2, a LED chip 3 arranged in the package 1, bump electrodes 4 connecting the metal parts 2 and the LED chip 3, and glass substrate 5 covering the light emitting surface of the LED chip 3. A mode for connecting the metal parts 2 and the LED chip 3 via the bump electrodes 4 in this way is called flip-chip type.

The first light emitting device (hereinafter, refers to "LED device") includes a sealing layer 6 to cover the light emitting element. The sealing layer 6 of the first LED device is a sealing layer to which the sealing material for the light emitting device according to the above described invention is applied. The sealing layer 6 has phosphor particles, and performs a function as a wavelength conversion portion (hereinafter, refers to "wavelength conversion type sealing layer") for converting the emission wavelength from the LED chip.

One LED chip 3 is arranged in the package 1 in the LED device 100 in FIG. 2; however, a plurality of the LED chips 3 may be arranged in the package 1.

Light Emitting Element

The package 1 is, for example, made of a liquid crystal polymer, or a ceramic; however the material thereof is not particularly limited as long as the material has insulation performance and heat resistance. Further, the shape thereof is not particularly limited, as long as having a flat shape, or a shape including a concave portion.

The LED chip 3 is, for example, a blue LED. As an example of the blue LED configuration, there is a laminate of an n-GaN based compound semiconductor layer (clad layer) layered on the package (LED substrate) 1, an InGaN based compound semiconductor layer (light emitting layer), a p-GaN based compound semiconductor layer (clad layer), and a transparent electrode layer. The LED chip 3 has, for example, a surface of 200 to 300 μm*200 to 300 μm, and a height of 50 to 200 μm.

The metal part 2 is a wiring made from a metal, such as silver, and sometimes functions as a reflection plate which reflects emitting light from the LED chip 3. The metal part 2 is connected to the LED chip via the bump electrode 4.

Further, the glass substrate 5 covering the light emitting surface of the LED chip 3 is arranged for the purpose of protecting the LED chip. The thickness of the glass substrate is typically 200 to 2000 μm.

The wavelength conversion type sealing layer 6 coves the package (LED substrate) 1. the metal parts (metal wirings) 2, the LED chip 3 arranged in the package 1, and the glass substrate 5 covering the light emitting surface of the LED chip 3 of the light emitting element.

Wavelength Conversion Type Sealing Layer

The thickness of the wavelength conversion type sealing layer 6 is not particularly limited since the layer is set according to the amount of the phosphor required by the LED device. It is, however, preferable to set the thickness of the wavelength conversion type sealing layer 6 as 10 μm or more and 500 μm or less. This is because that when the film thickness of the wavelength conversion type sealing layer 6 is less than 10 μm, the film thickness is not sufficient to retain typical phosphor particles having a particle diameter of 10 to 20 μm, exfoliation of the phosphor particles is occurred, and chromaticity variation is caused. Further, the exfoliation of the phosphor particles becomes a path of the sealing layer to cause deterioration of the sulfurization resistance. It is also because that when the film thickness of the sealing material for the light emitting device is 500 μm or more, a problem may occur such that light from a light source (that is, the LED chip 3) passes through the wavelength conversion type sealing layer 6, a difference of the number of the hit phosphor particles before emission becomes large, and chromaticity is changed in the central region and in the peripheral region of the light emitting device.

The lower limit of the thickness of the wavelength conversion type sealing layer 6 is not restricted; however, it is typically 15 μm or more, and preferably 20 μm or more.

Further, it is preferable that particle diameters of the phosphor particles and the inorganic fine particles contained in the wavelength conversion type sealing layer 6 are smaller than the thickness of the wavelength conversion type sealing layer 6.

The thickness of the wavelength conversion type sealing layer 6 means the maximum thickness of the layer arranged on the surface of the glass substrate 5 (see FIG. 2). Further, the thickness of the wavelength conversion type sealing layer 6 formed on the glass substrate 5 refers to the maximum thickness thereof. The thickness of the layer can be measured by using a laser hologage.

Forming Methods of the Wavelength Conversion Type Sealing Layer 6

Forming methods of the wavelength conversion type sealing layer 6 are classified broadly into a method of forming the layer by forming the above-described phosphor-containing sealing agent (one liquid type), and a method of forming the layer by respectively forming the above-described binder type sealing agent and a phosphor dispersion liquid (two liquid type).

[First Forming Method (One Liquid Type) of the Wavelength Conversion Type Sealing Layer 6]

In the case of forming the wavelength conversion type sealing layer 6 with the one liquid type method, it may be a method in which the above-described phosphor-containing sealing agent is applied to the above-described light emitting element to be cured.

The phosphor-containing sealing agent is applied so as to cover, among the light emitting element, at least the metal parts (metal wirings) 2, the side surface of the LED chip 3 arranged in the package 1, and the glass substrate 5. The application means is not limited; however, blade coating, spin coating, dispenser coating, spray coating, and the like, are exemplified. Specifically, it is preferable to use the spray coating since a thin coating film is easily formed, and a thin ceramic layer is therefore easily formed.

After applying the phosphor-containing sealing agent, polysiloxane and organic metal compounds are dried and cured by heating the coating film at 100 C.° or more, and preferably 150 C.° to 300 C.°. When the heating temperature is less than 100 C.°, the light resistance, and the like, of the coating film may be deteriorated because of not sufficiently removing the organic components, and the like, generated at dehydration condensation of silane compounds.

The wavelength conversion type sealing layer 6 may be further covered with a protection layer, and the like, after forming the wavelength conversion type sealing layer 6. Forming the protection layer may be carried out with a spray device, a dispenser device, or the like.

[Second Forming Method (Two Liquid Type) of the Wavelength Conversion Type Sealing Layer 6]

A forming method of the wavelength conversion type sealing layer 6 with the two liquid type may be a method including 1) a process in which a phosphor dispersion liquid is applied so as to cover the above-described light emitting element to arrange phosphor particles, and 2) a process in which the above-described binder type sealing agent is applied so as to cover the light emitting element to which the phosphor dispersion liquid has been applied to be cured. According to the method, the wavelength conversion type sealing layer 6 including phosphor-containing particles therein is formed.

Phosphor Dispersion Liquid

The phosphor dispersion liquid may be dispersion liquid prepared by dispersing phosphor particles and tabular particles in a solvent, or the like, and inorganic fine particles, and the like, may further be included. That is, the liquid is the same as that of the phosphor-containing sealing agent except that polysiloxane and organic metal compounds are not included. That is, the phosphor dispersion liquid can be prepared as the same way as the above-described phosphor-containing sealing agent including each component (phosphor particles, tabular particles, and inorganic fine particles), a solvent type, and the like.

It is preferable for the solvent of the phosphor dispersion liquid to include alcohols. The alcohols may be a monohydric alcohol, such as methanol, ethanol, propane, butanol, or the like, or a polyalcohol having a valence grater than two. Two or more kinds of alcohols may be combined. In the case of using a polyalcohol having a valence grater than two as a solvent, the viscosity of the phosphor dispersion liquid can be made easily increased, and sedimentation of the phosphor particles, which are dispersoid, can be easily prevented.

Any of the polyalcohol having a valence grater than two can be used as long as it can be used as a solvent, and, for example, ethylene glycol, propylene glycol, diethylene glycol, glycerin, 1,3-butanediol, 1,4-butanediol, and the like, are exemplified, and ethylene glycol, propylene glycol, 1,3-butanediol, and 1,4-butanediol are preferable.

Further, the phosphor dispersion liquid may be prepared in the same manner as the above-described phosphor-containing sealing agent, and, for example, the liquid may be prepared by mixing phosphor particles into a solvent, further mixing tabular particles thereto, and if necessary, adding other inorganic fine particles to the mixture.

In the above-described one liquid type phosphor-containing sealing agent, it is possible that a solvent, phosphor particles, polysiloxane, organic metal compounds, inorganic fine particles, tabular particles, and the like, are included, chemical reaction is generated in a time after the liquid preparation, and the viscosity becomes high over time. On the other hand, the chemical reaction as above is not generated in the phosphor dispersion liquid which dose not include the binder type sealing agent, such as polysiloxane, organic metal compounds, and the like, and the liquid becomes a stable liquid having a long pot life.

Application of the Phosphor Dispersion Liquid

The phosphor dispersion liquid is applied so as to cover, among the light emitting element, at least the metal parts (metal wirings) 2, the side surface of the LED chip 3 arranged in the package 1, and the glass substrate 5. The application means is not limited; however, the blade coating, the spin coating, the dispenser coating, the spray coating, and the like, are exemplified. Specifically, it is preferable to use the spray coating since a thin coating film is easily formed therewith. The coating film is dried if necessary, after the phosphor dispersion liquid is applied.

Application of the Binder Type Sealing Agent

The binder type sealing agent is applied so as to cover the phosphor particles. The application means is not limited; however, the blade coating, the spin coating, the dispenser coating, the spray coating, and the like, are exemplified. Specifically, it is preferable to use the spray coating since a thin coating film is easily formed therewith.

After applying the binder type sealing agent, polysiloxane and organic metal compounds are dried and cured by heating the coating film at 100 C.° or more, and preferably 150 C.° to 300 C.°. When the heating temperature is less than 100 C.°, the light resistance, and the like, of the coating film may be deteriorated because of not sufficiently removing the organic component, and the like, generated at dehydration condensation of silane compounds.

In the case of forming the wavelength conversion type sealing layer 6 with the two liquid type method, the phosphor dispersion liquid and the binder type sealing agent may be repeatedly and alternately applied to the light emitting element. Further, the wavelength conversion type sealing layer 6 may be further covered with a protection layer, and the like, after the wavelength conversion type sealing layer 6 is formed.

(Second Light Emitting Device)

A second light emitting device includes, for example, the light emitting element illustrated in the schematic cross-sectional diagram of FIG. 2B, and a sealing layer to cover the element. The light emitting element in the second light emitting device includes, for example, a package (LED substrate) 1, metal parts (metal wirings) 2, a LED chip 3 arranged in the package 1, and bump electrodes 4 connecting the metal parts 2 and the LED chip 3.

The second light emitting device further includes a sealing layer 6 to cover the light emitting element. The sealing layer 6 of this configuration is a sealing layer to which the sealing material for the light emitting device according to the above described invention is applied. The sealing layer 6 has phosphor particles, and performs a function as a wavelength conversion portion (wavelength conversion type sealing layer). That is, the light emitting device of the second configuration is the same as that of the first configuration, except not having the glass substrate 5 for protecting the LED chip, and the forming method of the wavelength conversion type sealing layer 6 can be the same. This is the same for the thickness of the sealing layer 6. That is, it is desirable to make the thickness as 10 μm or more and less than 500 μm.

One LED chip 3 is arranged at the concave portion of the package 1 in the LED device 100 in FIG. 2B; however, a plurality of the LED chips 3 may be arranged at the concave portion.

(Third Light Emitting Device)

A third light emitting device includes, for example, a light emitting element, a sealing layer 7 to cover the element, and a phosphor-containing resin layer 8 formed thereon for wavelength-converting light emitted from a LED chip 3, illustrated in the schematic cross-sectional diagram of FIG. 2C.

Specifically, the light emitting element in the third light emitting device includes, for example, a package (LED substrate) 1, metal parts (metal wirings) 2, the LED chip 3 arranged in the package 1, and bump electrodes 4 connecting the metal parts 2 and the LED chip 3.

The third light emitting device further includes the sealing layer 7 to cover the light emitting element, and the phosphor-containing resin layer 8 thereon for converting the emission wavelength of the LED 3. The sealing layer 7 is a sealing layer to which the sealing material for the light emitting device according to the above described invention is applied. That is, the light emitting device of the third configuration is the same as that of the second configuration, except having the sealing layer 7 and the phosphor-containing resin layer 8 instead of the wavelength conversion type sealing layer 6.

One LED chip 3 is arranged at the concave portion of the package 1 in the LED device 100 in FIG. 2C; however, a plurality of the LED chips 3 may be arranged at the concave portion.

In the third LED device, the light extract efficiency can be improved by including the sealing layer 7 compared to the semiconductor light emitting device including only the phosphor-containing resin layer 8. This is because that the refractive index of the sealing layer 7 becomes the median value between the refractive index of the LED chip surface and the refractive index of the phosphor-containing resin layer 8, since metal elements originating from organic metallic compounds are contained in the sealing layer 7. Thus, loss attributed to the interface reflection corresponding to an interface refractive index difference is reduced and the light extract efficiency is improved compared to the case that only the phosphor-containing resin layer 8 is included in the device.

(Sealing Layer 7)

The sealing layer covers the package (LED substrate) 1, the metal parts (metal wirings) 2, the LED chip 3 arranged in the package 1, and the light emitting surface of the LED chip 3, of the light emitting element.

The thickness of the sealing layer 7 is preferably 0.7 μm or more and 15 μm or less. This is because that when the thickness of the sealing layer 7 is less than 0.7 μm, the thickness is too thin to exhibit sufficient gas barrier properties. Thus, when the sealing layer is used outside, the metal reflection layer may be easily deteriorated by corrosive gasses, such as a sulfide gas, and the like, so that it is not suitable for a long term usage. Further, in the case that the film thickness of the sealing layer 7 is more than 15 μm, film cracking may be easily occurred, and accordingly corrosion by a sulfide gas, and the like, may also be easily occurred.

Furthermore, the particle diameter of the inorganic fine particles contained in the sealing layer 7 is preferably smaller than the thickness of the sealing payer 7. The thickness of the sealing layer 7 refers to the maximum thickness of a layer arranged on the LED chip 3. The thickness of the layer can be measured by using the laser hologage.

Forming Method of the Sealing Layer 7

The sealing layer 7 may be formed by applying the above-described binder type sealing agent. Specifically, the binder type sealing agent is applied so as to cover, among the light emitting element, the metal parts (metal wirings) 2, the LED chip 3 arranged in the package 1, the bump electrodes 4 connecting the metal parts 2 and the LED chip 3, and the light emitting surface of the LED chip 3. The application means is not limited; however, the blade coating, the spin coating, the dispenser coating, the spray coating, and the like, are exemplified. Specifically, it is preferable to use the spray coating since a thin coating film is easily formed therewith.

After applying the binder type sealing agent, polysiloxane and organic metal compounds are dried and cured by heating the coating film at 100 C.° or more, and preferably 150 C.° to 300 C.°. When the heating temperature is less than 100 C.°, the light resistance, and the like, of the coating film may be deteriorated because of not sufficiently removing the organic component, and the like, generated at dehydration condensation of silane compounds.

(Phosphor-Containing Resin Layer 8)

The phosphor-containing resin layer 8 is a layer for converting the emission wavelength of the LED chip, and layered on the above-described sealing layer 7. The phosphor-containing resin layer 8 is a layer in which phosphor particles are dispersed in a transparent resin. The phosphor particles may be the same phosphor particles contained in the above-described phosphor-containing sealing agent. The transparent resin may be, for example, a transparent thermosetting resin, specifically, a silicone resin, epoxy resin, and the like, are exemplified, and a silicone resin is particularly preferable.

The film thickness of the phosphor-containing resin layer is not particularly limited since the layer is set according to the amount of the phosphor required by the LED device. It is, however, typically preferable to set the thickness of the phosphor-containing resin layer 8 as 25 μm to 5 mm, and more preferably set as 1 to 3 mm. When the thickness of the phosphor-containing resin layer 8 exceeds the upper limit thereof, the concentration of the phosphor particles in the phosphor-containing resin layer 8 is typically excessively lowered; therefore, the phosphor particles may not be uniformly dispersed.

The concentration of the phosphor particles in the phosphor-containing resin layer is preferably 5 to 15% by mass, and more preferably 9 to 11% by mass.

In the forming method of the phosphor-containing resin layer 8, phosphor particles are dispersed in a liquid transparent resin (thermosetting resin), and the dispersion liquid is applied onto the above-described sealing layer 7 using an injection device, such as a dispenser, or the like. The phosphor-containing resin layer 8 then may be formed by heating and curing the coated dispersion liquid.

[Use of the Light Emitting Device]

The above-described light emitting device is further provided with other optical components (lenses, and the like) to be various optical members. It is suitable to use the light emitting device of the invention for vehicle light lamps, outdoor lighting equipment, and the like, since the device has superior sulfide gas resistance, light resistance, heat resistance, and the like.

Next, examples of the invention are described. However, the scope of the invention is not limited thereto. First of all, evaluation methods for each of the examples are described.

<Solid Si-NMR Spectrum Measurement and Silanol Content Ratio Calculation>

Solid Si-NMR spectrum measurement and waveform separation analysis were performed under the following conditions for a sealing material for a light emitting device of each example and each comparative example. The half width of each peak was determined for the sealing material for the light emitting device of each example and each comparative example from resultant wave form data. Further, a ratio of silicon atoms (%) of silanol in the whole silicon atoms was determined by a ratio of the peak area derived from the silanol to a total peak area, and compared with the content rate of the silicon separately analyzed to determine a content rate of the silanol.

<Device Condition>

Device: Infinity CMX-400 nuclear magnetic resonance spectroscope manufactured by Chemagnetics INC.

$^{29}$Si resonance frequency: 79.436 MHz

Probe: 7.5 mm φCP/MAS probe

Measurement temperature: Room temperature

Rotational frequency of sample: 4 kHz

Measuring method: Single pulse method $^{1}$H decoupling frequency: 50 kHz $^{29}$Si flip angle: 90°

$^{29}$Si 90° pulse width: 5.0 μs

Repetition time: 600 s
Number of count: 128 times
Observation width: 30 kHz
Broadening factor: 20 Hz
<Data Processing Method>
For the sealing material for the light emitting device of examples 1 to 24 and comparative examples 1 to 9, 512 points were taken in as measured data and zero-filled to 8192 points before Fourier transformation was performed.
<Waveform Separation Analyzing Method>
For each peak of the spectrum after Fourier transformation, an optimization calculation was performed by the nonlinear least square method with the center position, height, and a half width of a peak shape created by Lorentz waveform, Gauss waveform, or a mixture of both, as variable parameters.
For identification of peaks, AIChE Journal, 44(5), p. 1141, 1998, and the like, were referred.
<Adhesion Evaluation>
Cycle processing was performed on the produced LED device with a thermal shock testing machine (manufactured by ESPEC CORP.) at between −30° C. (for 30 minutes) and 100° C. (for 30 minutes). Occurrence of lighting failure of the LED device caused by film peeling was inspected after the above processing was done, and the sulfurization resistance was evaluated based on criteria illustrated below.
◎: no lighting failure in 2000 heat shock cycles
○: lighting failure occurs in 1500 or more heat shock cycles and less than 2000 cycles
Δ: lighting failure occurs in 1000 or more heat shock cycles and less than 1500 cycles
x: lighting failure occurs in less than 1000 heat shock cycles
<Sulfurization Resistance Evaluation>
Based on the gas exposure test (JIS C 60068-2-43) of JIS, whole luminous flux measurement was performed on the LED chip before and after the chip was exposed under the environment where the hydrogen sulfide-containing gas was 15 ppm, the temperature was 25° C., and the relative humidity was 75% RH for 1000 hours, and the sulfurization resistance evaluation was performed based on criteria illustrated below.
◎: the whole luminous flux to the initial value ratio (whole luminous flux value of the untreated article/whole luminous flux value of the sulfide gas treated article*100) is 98% or more
○: the whole luminous flux to the initial value ratio (whole luminous flux value of the untreated article/whole luminous flux value of the sulfide gas treated article*100) is 96% or more
Δ: the whole luminous flux to the initial value ratio (whole luminous flux value of the untreated article/whole luminous flux value of the sulfide gas treated article*100) is 92% or more and less than 96%
x: the whole luminous flux to the initial value ratio (whole luminous flux value of the untreated article/whole luminous flux value of the sulfide gas treated article*100) is 92% or less
<Crack Resistance Evaluation>
External observation was performed on the LED chip at 1000 magnification with SEM (VE7800, manufactured by KEYENCE Corporation), and the crack resistance evaluation was performed based on criteria illustrated below.
◎: the coating film exhibits no crack longer than 5 μm or more
○: the coating film exhibits no crack longer than 10 μm or more
Δ: the coating film exhibits 1 or more and 5 or less cracks having a length of 10 μm or more
x: the coating film exhibits 5 or more cracks having a length of 10 μm or more <Wet Heat Resistance Evaluation>
Whole luminous flux measurement was performed on the LED chip with a wet heat testing machine SH251 (ESPEC CORP.) before and after the chip was exposed under the environment of 80° C. and 90% Ph for 1000 hours, and the wet heat resistance was evaluation was performed based on criteria illustrated below.
◎: the whole luminous flux to the initial value ratio (whole luminous flux value of the untreated article/whole luminous flux value of the wet heat treated article*100) is 98% or more
○: the whole luminous flux to the initial value ratio (whole luminous flux value of the untreated article/whole luminous flux value of the wet heat treated article*100) is 96% or more
Δ: the whole luminous flux to the initial value ratio (whole luminous flux value of the untreated article/whole luminous flux value of the wet heat treated article*100) is 92% or more and less than 96%
x: the whole luminous flux to the initial value ratio (whole luminous flux value of the untreated article/whole luminous flux value of the wet heat treated article*100) is 92% or less
<Light Extract Efficiency Evaluation>
The light extract efficiency of the produced LED device was measured with a spectral radiance meter (CS-1000, manufactured by Konica Minolta Sensing Inc.) The measurement condition was to apply a current of 10 mA, and a relative value when the whole luminous flux value of the LED device having no sealing layer was 1.0 was evaluated based on criteria illustrated below.
◎: the relative value is 1.1 or more
○: the relative value is 1.03 to 1.09
Δ: the relative value is 0.98 to 1.02
x: the relative value is 0.97 or less
<Light Resistance Evaluation>
The sealing agent for the light emitting device used for the example 5, example 12, and example 13 was applied to slide glasses to bake at temperatures mentioned in the example 5, example 12, and example 13. The sealing agent was laminated to make a layer thereof having a film thickness of 10 μm after baking. Transmittance before and after processing at 150 mw for 100 hours for each slide glass was measured with a metal-halide lamp light resistance testing machine (M6T, manufactured by Suga Test Instruments Co., Ltd.), and the light resistance was then evaluated based on criteria illustrated below.
◎: less than 1.0% drop in the average transmittance of the light having a wavelength of 300 nm to 500 nm after processing
Δ: 1.0% or more and less than 1.5% drop in the average transmittance of the light having a wavelength of 300 nm to 500 nm after processing
x: 1.5% or more drop in the average transmittance of the light having a wavelength of 300 nm to 500 nm after processing
<Chromaticity Variation Evaluation>
Chromaticity of emission light emitted from the LED device in each example and comparative example was measured for following cases: (i) chromaticity of the emission light emitted from the front of the LED device; (ii) chromaticity of the emission light emitted from the front of the LED device by inclining by 60°; and (iii) chromaticity of the emission light emitted from the front of the LED device by inclining by −60° (inclining by 60° in the opposite direction from (ii)). The chromaticity was obtained by measuring an x-value and a y-value in the CIE colorimetric system with a spectral radiance meter (CS-1000A, manufactured by Konica Minolta Sensing Inc.) A z-coordinate which can be obtained from the relation of x+y+z=1 is omitted. Standard deviation was determined for each chromaticity (x-value and y-value) measured.

The chromaticity was then evaluated with the mean values of the x-value standard deviations and y-value the standard deviations. Evaluation criteria were illustrated below.

◎: the mean value of the standard deviations is 0.01 or less
Δ: the mean value of the standard deviations is more than 0.01 and 0.02 or less
x: the mean value of the standard deviations is more than 0.02

Next, each example and comparative example is explained in detail. First of all, a preparation method of phosphors used in each example and comparative example is summarized.

[Phosphor Preparation]

As phosphor raw materials, 7.41 g of $Y_2O_3$, 4.01 g of $Gd_2O_3$, 0.63 g of $CeO_2$, and 7.77 g of $Al_2O_3$ were well mixed. An optimal amount of ammonium fluoride was mixed thereto as a flux to fill an aluminum crucible. The filling was baked at a temperature within a range of 1350 to 1450° C. for 2 to 5 hours in a reducing atmosphere containing a hydrogen-containing nitrogen gas to obtain a baked product (($Y_{0.72}$ $Gd_{0.24})_3Al_5O_{12}$:$Ce_{0.04}$).

The obtained baked product was ground, washed, separated, and dried to obtain yellow phosphor particles having an average particle diameter of about 10 μm. When an emission wavelength in exciting light having a wavelength of 465 nm was measured, the light had a peak wavelength in a wavelength region of about 570 nm.

Next, specific conditions for producing the light emitting device as a sample for the examples 1 to 8 and comparative examples 1 to 9 and evaluation results thereof are summarized. As the sample for the examples 1 to 8 and the comparative examples 1 to 9, the first light emitting device illustrated in FIG. 2A is used. Further, evaluations of "adhesiveness", "crack resistance", "sulfurization resistance", and "wet heat resistance" are performed for each example. The evaluation results are summarized in FIG. 3A. FIG. 3A is a table in which each condition and evaluation results for the examples 1 to 8 and the comparative examples 1 to 9 are summarized.

Example 1

Production of LED Device 1-1

As the example 1, specific production conditions and evaluation results of a LED device 1-1, as a sample, are described. First of all, 23.6 g of methyltrimethoxysilane, 39.3 g of tetramethoxysilane, 40.0 g of methanol, and 40.0 g of acetone were mixed and stirred. 54.6 g of water and 4.7 μL of 60% nitric acid were added thereto, and further stirred for 3 hours. The mixture was then matured at 26° C. for 2 days. After that, the obtained composition thereby was diluted with methanol to make a solid content value of polysiloxane be 10%, and the sealing agent for the light emitting device was obtained having a polymerization molar ratio of trifunctional monomethylsilane compound:tetrafunctional silane compound was 4:6.

Further, 1 g of the phosphor particles prepared in the above method, 0.05 g of MK 100 (synthetic mica, manufactured by Co-op Chemical Co., LTD.), 0.05 g of RX300 (having 7 nm of average particle diameter of primary particles and 300 m²/g of specific surface area, produced by NIPPON AEROSIL CO., LTD), and 1.5 g of propylene glycol are mixed to prepare a phosphor dispersion liquid. The prepared phosphor dispersion liquid was applied with a spray on to a glass substrate placed on the light emitting element (LED chip) configured as illustrated in FIG. 2A, and dried at 50° C. for 1 hour, and the phosphor particles were then placed on the glass substrate.

The light emitting device is a LED chip mounting package in which one blue LED chip (rectangular parallelepiped shape: 200 μm*300 μm*100 μm) was flip-chip mounted on the center of a flat package, a glass substrate (200 μm*300 μm*500 μm) was arranged on the LED chip.

The above-described sealing agent for the light emitting device (binder type sealing agent) was then applied with a spray to the phosphor particles arranged by the above method. After that, the particles were baked at 150° C. for 1 hour, and a phosphor-containing sealing layer 6 was provided; thereby, the LED device 1-1 having a sealing layer (wavelength conversion type sealing layer) having a thickness of 10 μm, and including the phosphor particles was obtained.

When the solid Si-NMR spectrum was performed on the sealing layer of the LED device 1-1, the Q″ peak group having a half width of 5 ppm, and the T″ peak group having a half width of 5 ppm were observed, and no D″ peak group was observed. Further, the silanol content ratio in the sealing layer was 20%.

As shown in FIG. 3A, the evaluation results in the example 1 are such that "○" in the adhesiveness, "○" in the crack resistance, "○" in the sulfurization resistance, and "○" in the wet heat resistance.

Example 2

Production of LED Device 1-2

Next, as the example 2, specific production conditions and evaluation results of a LED device 1-2, as a sample, are described. In the present example, a sealing agent for the light emitting device was prepared such that an added amount 29.5 g of methyltrimethoxysilane, and an added amount 32.8 g of tetramethoxysilane were used to produce a silane compound, and the polymerization molar ratio of the trifunctional monomethyl silane compound:the tetrafunctional silane compound was 4:6. Other conditions are the same as that of the LED device 1-1. The LED device 1-2 was thereby obtained.

When the solid Si-NMR spectrum was performed on the sealing layer of the LED device 1-2, the Q″ peak group having a half width of 9 ppm, and the T″ peak group having a half width of 9 ppm were observed (detected), and no D″ peak group was observed. Further, the silanol content ratio in the sealing layer was 20%.

As shown in FIG. 3A, the evaluation results in the example 2 are such that "○" in the adhesiveness, "○" in the crack resistance, "○" in the sulfurization resistance, and "○" in the wet heat resistance.

Example 3

Production of LED Device 1-3

Next, as the example 3, specific production conditions and evaluation results of a LED device 1-3, as a sample, are described. In the present example, a sealing agent for the light emitting device was prepared such that an added amount 35.4 g of methyltrimethoxysilane, and an added amount 26.2 g of tetramethoxysilane were used to produce a silane compound, and the polymerization molar ratio of the trifunctional monomethyl silane compound:the tetrafunctional silane compound was 6:4. Other conditions are the same as that of the LED device 1-1. The LED device 1-3 was thereby obtained.

When the solid Si-NMR spectrum was performed on the sealing layer of the LED device 1-3, the Q″ peak group having a half width of 12 ppm, and the T″ peak group having a half width of 12 ppm were observed, but no D″ peak group was observed. Further, the silanol content ratio in the sealing layer was 20%.

As shown in FIG. 3A, the evaluation results in the example 3 are such that "○" in the adhesiveness, "○" in the crack resistance, "○" in the sulfurization resistance, and "○" in the wet heat resistance.

Example 4

Production of LED Device 1-4

Next, as the example 4, specific production conditions and evaluation results of a LED device 1-4, as a sample, are described. In the present example, a sealing agent for the light emitting device was prepared such that an added amount 13.0 g of dimethyldimethoxysilane, an added amount 29.4 g of methyltrimethoxysilane, and an added amount 16.4 g of tetramethoxysilane were used to produce a silane compound, and the polymerization molar ratio of a bifunctional dinomethyl silane compound:the trifunctional monomethyl silane compound:the tetrafunctional silane compound was 25:50:25. Other conditions are the same as that of the LED device 1-1. The LED device 1-4 was thereby obtained.

When the solid Si-NMR spectrum was performed on the sealing layer of the LED device 1-4, the Q″ peak group having a half width of 5 ppm, the T″ peak group having a half width of 5 ppm, and the D″ peak group having a half width of 5 ppm were observed. Further, the silanol content ratio in the sealing layer was 20%.

As shown in FIG. 3A, the evaluation results in the example 4 are such that "○" in the adhesiveness, "○" in the crack resistance, "○" in the sulfurization resistance, and "○" in the wet heat resistance.

Example 5

Production of LED Device 1-5

Next, as the example 5, specific production conditions and evaluation results of a LED device 1-5, as a sample, are described. In the present example, a sealing agent for the light emitting device was prepared such that an added amount 6.0 g of dimethyldimethoxysilane, an added amount 23.4 g of methyltrimethoxysilane, and an added amount 29.5 g of tetramethoxysilane were used to produce a silane compound, and the polymerization molar ratio of the bifunctional dinomethyl silane compound:the trifunctional monomethylsilane compound:the tetrafunctional silane compound was 15:40:45, and thereby the sealing agent for the light emitting device having a solid concentration of 10% was obtained. Other conditions are the same as that of the LED device 1-1. The LED device 1-5 was thereby obtained.

When the solid Si-NMR spectrum was performed on the sealing layer of the LED device 1-5, the Q″ peak group having a half width of 9 ppm, the T″ peak group having a half width of 9 ppm, and the D″ peak group having a half width of 9 ppm were observed. Further, the silanol content ratio in the sealing layer was 20%.

As shown in FIG. 3A, the evaluation results in the example 5 are such that "○" in the adhesiveness, "○" in the crack resistance, "○" in the sulfurization resistance, and "○" in the wet heat resistance.

Example 6

Production of LED Device 1-6

Next, as an example 6, specific production conditions and evaluation results of a LED device 1-6, as a sample, are described. In the present example, a sealing agent for the light emitting device was prepared such that an added amount 5.2 g of dimethyldimethoxysilane, an added amount 17.6 g of methyltrimethoxysilane, and an added amount 39.4 g of tetramethoxysilane were used to produce a silane compound, and the polymerization molar ratio of the bifunctional dinomethyl silane compound:the trifunctional monomethyl silane compound:the tetrafunctional silane compound was 10:30:60. Other conditions are the same as that of the LED device 1-1. The LED device 1-6 was thereby obtained.

When the solid Si-NMR spectrum was performed on the sealing layer of the LED device 1-6, the Q″ peak group having a half width of 12 ppm, the T″ peak group having a half width of 12 ppm, and the D″ peak group having a half width of 12 ppm were observed. Further, the silanol content ratio in the sealing layer was 20%.

As shown in FIG. 3A, the evaluation results in the example 6 are such that "○" in the adhesiveness, "○" in the crack resistance, "○" in the sulfurization resistance, and "○" in the wet heat resistance.

Example 7

Production of LED Device 1-7

Next, as the example 7, specific production conditions and evaluation results of a LED device 1-7, as a sample, are described. In the present example, a sealing agent for the light emitting device was prepared such that an added amount 13.0 g of dimethyldimethoxysilane, an added amount 29.3 g of methyltrimethoxysilane, and an added amount 16.4 g of tetramethoxysilane were used to produce a silane compound, and the polymerization molar ratio of the bifunctional dinomethyl silane compound:the trifunctional monomethyl silane compound:the tetrafunctional silane compound was 25:50:25. Other conditions are the same as that of the LED device 1-1. The LED device 1-7 was thereby obtained.

When the solid Si-NMR spectrum was performed on the sealing layer of the LED device 1-7, the Q″ peak group having a half width of 9 ppm, the T″ peak group having a half width of 9 ppm, and the D″ peak group having a half width of 9 ppm were observed. Further, the silanol content ratio in the sealing layer was 11%.

As shown in FIG. 3A, the evaluation results in the example 7 are such that "○" in the adhesiveness, "○" in the crack resistance, "○" in the sulfurization resistance, and "○" in the wet heat resistance.

Example 8

Production of LED Device 1-8

Next, as the example 8, specific production conditions and evaluation results of a LED device 1-8, as a sample, are described. In the present example, a sealing agent for the light emitting device was prepared such that an added amount 5.2 g of dimethyldimethoxysilane, an added amount 17.6 g of methyltrimethoxysilane, and an added amount 39.4 g of tetramethoxysilane were used to produce a silane compound, and the polymerization molar ratio of the bifunctional dinomethyl silane compound:the trifunctional monomethyl silane compound:the tetrafunctional silane compound was 10:30:60. Other conditions are the same as that of the LED device 1-1. The LED device 1-8 was thereby obtained.

When the solid Si-NMR spectrum was performed on the sealing layer of the LED device 1-8, the Q″ peak group having a half width of 12 ppm, the T″ peak group having a half width of 12 ppm, and the D″ peak group having a half width of 12 ppm were observed. Further, the silanol content ratio in the sealing layer was 30%.

As shown in FIG. 3A, the evaluation results in the example 8 are such that "○" in the adhesiveness, "○" in the crack resistance, "○" in the sulfurization resistance, and "○" in the wet heat resistance.

Comparative Example 1

Production of LED Device 1-9

Next, as the comparative example 1, specific production conditions and evaluation results of a LED device 1-9, as a sample, are described. In the present comparative example, a sealing agent for the light emitting device was prepared with 65.6 g of tetramethoxysilane as a silane compound, and the polymerization molar ratio of the bifunctional dinomethyl silane compound:the trifunctional monomethylsilane compound:the tetrafunctional silane compound was 0:0:100. Other conditions are the same as that of the LED device 1-1. The LED device 1-9 was thereby obtained.

When the solid Si-NMR spectrum was performed on the sealing layer of the LED device 1-9, the Q″ peak group having a half width of 15 ppm was observed, but neither the T″ peak group nor D″ peak group were observed. Further, the silanol content ratio in the sealing layer was 35%.

As shown in FIG. 3A, the evaluation results in the comparative example 1 are such that "○" in the adhesiveness, "x" in the crack resistance, "x" in the sulfurization resistance, and "x" in the wet heat resistance.

Comparative Example 2

Production of LED Device 1-10

Next, as the comparative example 2, specific production conditions and evaluation results of a LED device 1-10, as a sample, are described. In the present comparative example, a sealing agent for the light emitting device was prepared with 58.7 g of methyltrimethoxysilane as a silane compound, and the polymerization molar ratio of the bifunctional dinomethyl silane compound:the trifunctional monomethylsilane compound:the tetrafunctional silane compound was 0:100:0. Other conditions are the same as that of the LED device 1-1. The LED device 1-10 was thereby obtained.

When the solid Si-NMR spectrum was performed on the sealing layer of the LED device 1-10, the T″ peak group having a half width of 8 ppm was observed, but neither the Q″ peak group nor D″ peak group were observed. Further, the silanol content ratio in the sealing layer was 20%.

As shown in FIG. 3A, the evaluation results in the comparative example 2 are such that "Δ" in the adhesiveness, "○" in the crack resistance, "x" in the sulfurization resistance, and "x" in the wet heat resistance.

Comparative Example 3

Production of LED Device 1-11

Next, as the comparative example 3, specific production conditions and evaluation results of a LED device 1-11, as a sample, are described. In the present comparative example, a sealing agent for the light emitting device was prepared with 51.8 g of dimethyldimethoxysilane as a silane compound, and the polymerization molar ratio of the bifunctional dinomethyl silane compound:the trifunctional monomethylsilane compound:the tetrafunctional silane compound was 100:0:0. Other conditions are the same as that of the LED device 1-1. The LED device 1-11 was thereby obtained.

When the solid Si-NMR spectrum was performed on the sealing layer of the LED device 1-11, the D″ peak group having a half width of 2 ppm was observed, but neither the Q″ peak group nor T″ peak group were observed. Further, the silanol content ratio in the sealing layer was 8%.

As shown in FIG. 3A, the evaluation results in the comparative example 3 are such that "x" in the adhesiveness, "○" in the crack resistance, "x" in the sulfurization resistance, and "x" in the wet heat resistance.

Comparative Example 4

Production of LED Device 1-12

Next, as the comparative example 4, specific production conditions and evaluation results of a LED device 1-12, as a sample, are described. In the present comparative example, a sealing agent for the light emitting device was prepared such that 20.8 g of dimethyldimethoxysilane, and an added amount 35.3 g of methyltrimethoxysilane were used to produce a silane compound, and the polymerization molar ratio of the bifunctional dinomethyl silane compound:the trifunctional monomethylsilane compound:the tetrafunctional silane compound was 40:60:0. Other conditions are the same as that of the LED device 1-1. The LED device 1-12 was thereby obtained.

When the solid Si-NMR spectrum was performed on the sealing layer of the LED device 1-12, the T″ peak group having a half width of 8 ppm, and the D″ peak group having a half width of 8 ppm were observed, but no Q″ peak group was observed. Further, the silanol content ratio in the sealing layer was 8%.

As shown in FIG. 3A, the evaluation results in the comparative example 4 are such that "x" in the adhesiveness, "○" in the crack resistance, "x" in the sulfurization resistance, and "x" in the wet heat resistance.

Comparative Example 5

Production of LED Device 1-13

Next, as the comparative example 5, specific production conditions and evaluation results of a LED device 1-13, as a sample, are described. In the present comparative example, a sealing agent for the light emitting device was prepared such that 26.0 g of dimethyldimethoxysilane and an added amount 32.9 g of tetramethoxysilane were used to produce a silane compound, and the polymerization molar ratio of the bifunctional dinomethyl silane compound:the trifunctional monomethylsilane compound:the tetrafunctional silane compound was 50:0:50. Other conditions are the same as that of the LED device 1-1. The LED device 1-13 was thereby obtained.

When the solid Si-NMR spectrum was performed on the sealing layer of the LED device 1-13, the Q″ peak group having a half width of 8 ppm, and the D″ peak group having a half width of 8 ppm were observed, but no T″ peak group was observed. Further, the silanol content ratio in the sealing layer was 20%.

As shown in FIG. 3A, the evaluation results in the comparative example 5 are such that "Δ" in the adhesiveness, "Δ" in the crack resistance, "x" in the sulfurization resistance, and "x" in the wet heat resistance.

Comparative Example 6

Production of LED Device 1-14

Next, as the comparative example 6, specific production conditions and evaluation results of a LED device 1-14, as a sample, are described. In the present comparative example, a sealing agent for the light emitting device was prepared such that an added amount 44.1 g of methyltrimethoxysilane, and an added amount 5.5 g of tetramethoxysilane were used to produce a silane compound, and the polymerization molar ratio of the bifunctional dinomethyl silane compound:the trifunctional monomethylsilane compound:the tetrafunctional silane compound was 0:90:10. Other conditions are the same as that of the LED device 1-1. The LED device 1-14 was thereby obtained.

When the solid Si-NMR spectrum was performed on the sealing layer of the LED device 1-14, the $Q''$ peak group having a half width of 2 ppm, and the $T''$ peak group having a half width of 2 ppm were observed, but no $D''$ peak group was observed. Further, the silanol content ratio in the sealing layer was 20%.

As shown in FIG. 3A, the evaluation results in the comparative example 6 are such that "○" in the adhesiveness, "○" in the crack resistance, "x" in the sulfurization resistance, and "x" in the wet heat resistance.

Comparative Example 7

Production of LED Device 1-15

Next, as the comparative example 7, specific production conditions and evaluation results of a LED device 1-15, as a sample, are described. In the present comparative example, a sealing agent for the light emitting device was prepared such that an added amount 4.9 g of methyltrimethoxysilane, and an added amount 49.3 g of tetramethoxysilane were used to produce a silane compound, and the polymerization molar ratio of the bifunctional dinomethyl silane compound:the trifunctional monomethylsilane compound:the tetrafunctional silane compound was 0:10:90. Other conditions are the same as that of the LED device 1-1. The LED device 1-15 was thereby obtained.

When the solid Si-NMR spectrum was performed on the sealing layer of the LED device 1-15, the $Q''$ peak group having a half width of 15 ppm and the $T''$ peak group having a half width of 15 ppm were observed, and no $D''$ peak group was observed. Further, the silanol content ratio in the sealing layer was 20%.

As shown in FIG. 3A, the evaluation results in the comparative example 7 are such that "Δ" in the adhesiveness, "x" in the crack resistance, "x" in the sulfurization resistance, and "x" in the wet heat resistance.

Comparative Example 8

Production of LED Device 1-16

Next, as the comparative example 8, specific production conditions and evaluation results of a LED device 1-16, as a sample, are described. In the present comparative example, a sealing agent for the light emitting device was prepared, an added amount 30.3 g of dimethyldimethoxysilane, an added amount 9.8 g of methyltrimethoxysilane, and an added amount 5.5 g of tetramethoxysilane were used to produce a silane compound, and the polymerization molar ratio of the bifunctional dinomethyl silane compound:the trifunctional monomethyl silane compound:the tetrafunctional silane compound was 70:20:10. Other conditions are the same as that of the LED device 1-1. The LED device 1-16 was thereby obtained.

When the solid Si-NMR spectrum was performed on the sealing layer of the LED device 1-16, the $Q''$ peak group having a half width of 2 ppm, the $T''$ peak group having a half width of 2 ppm, and the $D''$ peak group having a half width of 2 ppm were observed. Further, the silanol content ratio in the sealing layer was 8%.

As shown in FIG. 3A, the evaluation results in the comparative example 8 are such that "x" in the adhesiveness, "○" in the crack resistance, "x" in the sulfurization resistance, and "x" in the wet heat resistance.

Comparative Example 9

Production of LED Device 1-17

Next, as the comparative example 9, specific production conditions and evaluation results of a LED device 1-17, as a sample, are described. In the present comparative example, a sealing agent for the light emitting device was prepared such that an added amount 4.3 g of dimethyldimethoxysilane, an added amount 14.7 g of methyltrimethoxysilane, and an added amount 32.9 g of tetramethoxysilane were used to produce a silane compound, and the polymerization molar ratio of the bifunctional dinomethyl silane compound:the trifunctional monomethyl silane compound:the tetrafunctional silane compound was 10:30:60. Other conditions are the same as that of the LED device 1-1. The LED device 1-17 was thereby obtained.

When the solid Si-NMR spectrum was performed on the sealing layer of the LED device 1-17, the $Q''$ peak group having a half width of 15 ppm, the $T''$ peak group having a half width of 15 ppm, and the $D''$ peak group having a half width of 15 ppm were observed. Further, the silanol content ratio in the sealing layer was 8%.

As shown in FIG. 3A, the evaluation results in the comparative example 9 are such that "Δ" in the adhesiveness, "x" in the crack resistance, "x" in the sulfurization resistance, and "x" in the wet heat resistance.

As the above evaluation results show, when the following conditions are satisfied (that is, the examples 1 to 8), it is possible to achieve both the adhesiveness and the crack resistance, and obtain the high sulfurization resistance and wet heat resistance:

- in the solid Si-NMR spectrum, a peak has a peak top in a chemical shift within a range of −120 ppm or more and −90 ppm or less (that is, a $Q''$ peak group), and a half width of 5 ppm or more and 12 ppm or less;
- in the solid Si-NMR spectrum, a peak has a peak top in a chemical shift within a range of −80 ppm or more and −40 ppm or less (that is, a $T''$ peak group), and a half width of 5 ppm or more and 12 ppm or less; and
- a silanol content ratio is 11% by weight (weight %) or more and 30% by weight or less.

This can be considered that, in the solid Si-NMR spectrum, when the peak half width becomes 5 ppm or more and 12 ppm or less and a silanol content ratio becomes 11% or more and 30% or less, an optimum ratio of each of the $Q''$ compound having many bonding hands which lead to the adhesiveness resistant to heat shock and the $T''$ compound which suppresses the generation of cracks by reducing stress to a whole was achieved. It is also considered that, in this case, since the film was a fine film having no film crack and a sufficiently high degree of crosslinking, permeation of the sulfide gas and water vapor was suppressed and corrosion and deterioration of the metal parts 2 were also suppressed.

On the other hand, it is shown that, in the comparative examples 1, 7 and 9 where the peak half width was a large value as 15 ppm, the degree of crosslinking of the film was too high and the film was generated to be hard, but otherwise easily broken, so that the crack resistance was dropped. It is also considered that, according to the generation of the cracks, the gas barrier properties of the sealing layer were dropped, and the sulfurization resistance as well as the wet heat resistance was also dropped.

Further, in the comparative examples 3, 6 and 8 where the peak half width was a small value as 2 ppm and the silanol content ratio was less than 10%, the film had a low degree of crosslinking and the crack resistance. It is, however, considered that, the adhesiveness became insufficient since the chemical bounds of the sealing layer 6 with the package 1, the metal parts 2, the LED chip 3, and the glass substrate 5 were insufficient. It is also considered that, the sealing layer became such that the gas barrier properties were low, and the sulfurization resistance as well as the wet heat resistance was also low, since the film became a coarse film having a low degree of crosslinking.

Next, on the basis of the LED device 1-5 shown in the example 5, a LED device 1-18 to a LED device 1-20 were produced by adding inorganic oxide particles into each sealing agent for the light emitting device, and evaluations of "adhesiveness", "crack resistance", "sulfurization resistance", "wet heat resistance", and "light extraction efficiency" were performed on those devices in examples 9 to 11, respectively. The evaluation results of those are summarized in FIG. 3B. FIG. 3B is a table in which each condition and evaluation result of the example 5, and examples 9 to 10 are summarized. As shown in FIG. 3B, the evaluation results in the example 5 are such that "○" in the adhesiveness, "○" in the crack resistance, "○" in the sulfurization resistance, "○" in the wet heat resistance, and "○" in the light resistance efficiency.

Example 9

Production of LED Device 1-18

Next, as the example 9, specific production conditions and evaluation results of the LED device 1-18, as a sample, are described. In the present example, a sealing agent for the light emitting device was prepared, the sealing agent for the light emitting device used in the LED device 1-5 production was further added with a slurry (TECNADIS-ZR-220, manufactured by TECNAN Ltd.) in which $ZrO_2$ fine particles were dispersed so as to make the ratio of the $ZrO_2$ fine particles be 15% of a total solid content. Other conditions are the same as that of the LED device 1-5. The LED device 1-18 was thereby obtained.

As shown in FIG. 3B, the evaluation results in the example 9 are such that "⊚" in the adhesiveness, "⊚" in the crack resistance, "○" in the sulfurization resistance, "○" in the wet heat resistance, and "⊚" in the light extraction efficiency.

Example 10

Production of LED Device 1-19

Next, as the example 10, specific production conditions and evaluation results of the LED device 1-19, as a sample, are described. In the present example, a sealing agent for the light emitting device was prepared such that the sealing agent for the light emitting device used in the LED device 1-5 production was further added with a slurry (TECNADIS-TI-220, manufactured by TECNAN Ltd.) in which $TiO_2$ fine particles were dispersed so as to make the ratio of the $TiO_2$ fine particles be 15% by weight based on a total solid content. Other conditions are the same as that of the LED device 1-5. The LED device 1-19 was thereby obtained.

As shown in FIG. 3B, the evaluation results in the example 10 are such that "⊚" in the adhesiveness, "⊚" in the crack resistance, "○" in the sulfurization resistance, "○" in the wet heat resistance, and "○" in the light extraction efficiency.

Example 11

Production of LED Device 1-20

Next, as an example 11, specific production conditions and evaluation results of a LED device 1-20, as a sample, are described. In the present example, a sealing agent for the light emitting device was prepared such that the sealing agent for the light emitting device used in the LED device 1-5 production was further added with a slurry (TECNADIS-AL-220, manufactured by TECNAN Ltd.) in which $Al_2O_3$ fine particles were dispersed so as to make the ratio of the $Al_2O_3$ fine particles be 15% of a total solid content. Other conditions are the same as that of the LED device 1-5. The LED device 1-20 was thereby obtained.

As shown in FIG. 3B, the evaluation results in the example 11 are such that "⊚" in the adhesiveness, "⊚" in the crack resistance, "○" in the sulfurization resistance, "○" in the wet heat resistance, and "○" in the light extraction efficiency.

In the examples 9 to 11, when the solid Si-NMR spectrum was performed on each of the sealing layers (wavelength conversion type sealing layers) for the LED device 1-18 to the LED device 1-20, the $Q''$ peak group having a half width of 9 ppm, the $T''$ peak group having a half width of 9 ppm, and the $D''$ peak group having a half width of 9 ppm were observed for each case. Further, the silanol content ratio in each of the sealing layers was 20%.

As the above evaluation results show, in the examples 9 to 11 in each of which the sealing agent for the light emitting element contains the inorganic fine particles, a film strength was improved therefore the crack resistance was improved, compared to the example 5 in which the sealing agent for the light emitting element contains no inorganic fine particle ($ZrO_2$, $TiO_2$, or $AL_2O_3$). Further, in the example 9 in which $ZrO_2$ was used as the inorganic fine particles, the light extraction efficiency was also improved. It is considered that this is because although the light emitting element portion of the LED is a high refractive index material having a refractive index of 1.7 or more, a light extraction loss caused by the reflection at an interface between the light emitting element portion and the sealing layer 6 was reduced since $ZrO_2$ particles having a high refractive index and little light absorption in a visible light region were added to the sealing layer 6.

Next, on the basis of the LED device 1-5 shown in the example 5, a LED device 1-21 and a LED device 1-22 were produced by changing the curing temperature (that is, temperature in baking) for the sealing agent for the light emitting device, and evaluations of "adhesiveness", "crack resistance", "sulfurization resistance", "wet heat resistance", and "light resistance" were then performed on those devices in examples 12 and 13, respectively. The evaluation results of those are summarized in FIG. 3C. FIG. 3C is a table in which each condition and evaluation result of the example 5, and examples 12, and 13 are summarized. In the example 5, baking of the sealing agent for the light emitting device (binder type sealing agent) has been performed at 150 C.° for 1 hour after the agent was sprayed over phosphor particles. As shown in FIG. 3C, the evaluation results in the example 5 are such that "○" in the adhesiveness, "○" in the crack resistance, "○" in the sulfurization resistance, "○" in the wet heat resistance, and "○" in the light resistance evaluation.

Example 12

Production of LED Device 1-21

Next, as the example 12, specific production conditions and evaluation results of the LED device 1-21, as a sample, are described. In the present example, baking of the sealing agent for the light emitting device (binder type sealing agent) was performed at 80 C.° for 1 hour after the agent was sprayed over phosphor particles. Other conditions are the same as that of the LED device 1-5. The LED device 1-21 was thereby obtained.

As shown in FIG. 3C, the evaluation results in the example 12 are such that "○" in the adhesiveness, "○" in the crack resistance, "⊚" in the sulfurization resistance, "○" in the wet heat resistance, and "Δ" in the light resistance evaluation.

Example 13

Production of LED Device 1-22

Next, as the example 13, specific production conditions and evaluation results of the LED device 1-22, as a sample, are described. In the present example, baking of the sealing agent for the light emitting device (binder type sealing agent) was performed at 100 C.° for 1 hour after the agent was sprayed over phosphor particles. Other conditions are the same as that of the LED device 1-5. The LED device 1-22 was thereby obtained.

As shown in FIG. 3C, the evaluation results in the example 13 are such that "○" in the adhesiveness, "○" in the crack resistance, "○" in the sulfurization resistance, "○" in the wet heat resistance, and "○" in the light resistance evaluation.

In the examples 12 and 13, when the solid Si-NMR spectrum was performed on the sealing layer (wavelength conversion type sealing layer) of the LED device 1-21 and the LED device 1-22, the $Q''$ peak group having a half width of 9 ppm, the $T''$ peak group having a half width of 9 ppm, and the $D''$ peak group having a half width of 9 ppm were observed. Further, the silanol content ratio in the sealing layer was 20%.

As the above evaluation results show, in the examples 5 and 13 where the curing temperature for the sealing agent for the light emitting element was 100° C. or more, the light resistance evaluation result was good. On the other hand, in the example 12 where the curing temperature for the sealing agent for the light emitting element was less than 100° C., the light resistance was slightly decreased. This is because that organic matters, such as polysiloxane, and the like, generated by the hydrolysis reaction is sufficiently removed by setting the film forming temperature of the sealing layer as 100° C. or more. Contrary, when the film forming temperature is less than 100° C., vaporization of the organic matters generated by the hydrolysis reaction is insufficient, and the organic matters remain in the film, so that it is considered that the light resistance is lowered.

Next, on the basis of the LED device 1-5 illustrated in example 5, a LED device 1-23 and a LED device 1-24 were produced by adjusting the film thickness of the sealing layer by adjusting an added amount of synthetic mica, when a phosphor dispersion liquid was prepared, and evaluations of "adhesiveness", "crack resistance", "sulfurization resistance", "wet heat resistance", and "chromaticity variation" were then performed on those devices in examples 14 and 15, respectively. The evaluation results of those were summarized in FIG. 3D. FIG. 3D is a table in which each condition and evaluation result of the examples 14 to 15 are summarized. The film thickness of the sealing layer in the example 5 is 10 μm. The evaluation results of the example 5 are, as shown in FIG. 3D, such that "○" in the adhesiveness, "○" in the crack resistance, "○" in the sulfurization resistance, "○" in the wet heat resistance, and "○" in the chromaticity variation.

Example 14

Production of LED Device 1-23

Next, as the example 14, specific production conditions and evaluation results of a LED device 1-23, as a sample, are described. In the present example, an added amount 0.02 g of MK-100 (synthetic mica, manufactured by Co-op Chemical Co., LTD.) was added to the phosphor dispersion liquid. Other conditions are the same as that of the LED device 1-5. The LED device 1-23 was thereby obtained. When a sealing layer is formed under the above conditions, the film thickness will be 100 μm.

As shown in FIG. 3D, the evaluation results in the example 14 are such that "○" in the adhesiveness, "○" in the crack resistance, "○" in the sulfurization resistance, "○" in the wet heat resistance, and "○" in the chromaticity variation.

Example 15

Production of LED Device 1-24

Next, as the example 15, specific production conditions and evaluation result of the LED device 1-24, as a sample, are described. In the present example, an added amount 0.45 g of MK-100 (synthetic mica, manufactured by Co-op Chemical Co., LTD.) was added to the phosphor dispersion liquid. Other conditions are the same as that for the LED device 1-5. The LED device 1-24 was thereby obtained. When a sealing layer is formed under the above conditions, the film thickness will be 450 μm.

As shown in FIG. 3D, the evaluation results in the example 15 are such that "○" in the adhesiveness, "○" in the crack resistance, "○" in the sulfurization resistance, "○" in the wet heat resistance, and "○" in the chromaticity variation.

In the examples 14 and 15, when the solid Si-NMR spectrum was performed on each of the sealing layers (wavelength conversion type sealing layers) of the LED device 1-23 and the LED device 1-24, the $Q''$ peak group having a half width of 9 ppm, the $T''$ peak group having a half width of 9 ppm, and the $D''$ peak group having a half width of 9 ppm were observed in each case. Further, the silanol content ratio in each of the sealing layers was 20%.

As the above evaluation results show, in the case of producing the light emitting device with the configuration illustrated in FIG. 2A using the above-mentioned sealing material for the light emitting device (for example, the example 5), when the film thickness of the sealing layer was changed to 10 μm, 100 μm, and 450 μm, it was confirmed that, for each case, excellent adhesiveness, crack resistance, sulfurization resistance, wet heat resistance, and chromaticity variation can be obtained.

Next, LED devices 2-1 to 2-24 as samples having the configuration of the second light emitting device shown in FIG. 2B, and LED devises 3-1 to 3-22 and 3-23 to 3-31 as samples having the configuration of the third light emitting device shown in FIG. 2C were produced, and evaluations were performed thereon, respectively. Hereinafter, a producing method, evaluation methods, and evaluation results thereof are summarized for each sample. First of all, the production method for the LED devices 2-1 to 2-14 is summarized.

As shown in FIG. 3, a light emitting element (LED chip) having a package 1 (LED substrate) with a concave portion was prepared. Specifically, a LED chip mounting package in which one blue LED chip (rectangular parallelepiped shape: 200 μm*300 μm*100 μm) was flip-chip mounted onto the center of a housing portion of a circular package (3 mm of an opening diameter, 2 mm of bottom surface diameter, and 60° of wall surface angle), was prepared. On the LED chip mounting package, a sealing layer was directly formed under the same conditions except having no glass substrate, with the use of the phosphor dispersed liquid and the sealing agent for the light emitting element respectively same as those used for the above-described LED devices 1-1 to 1-24, to obtain the LED devices 2-1 to 2-24.

Next, the producing method for the LED devices 3-11 to 3-22 is summarized. Like the LED devices 2-1 to 2-22, a light emitting device (LED chip) having a package (LED substrate) with a concave portion was prepared as the configuration shown in FIG. 2C. Specifically, a LED chip mounting package in which one blue LED chip (rectangular parallelepiped shape: 200 μm*300 μm*100 μm) was flip-chip mounted onto the center of a housing portion of a circular package (3 mm of an opening diameter, 2 mm of bottom surface diameter, and 60° of wall surface angle) was prepared.

Except not applying the phosphor dispersed liquid onto the LED chip mounting package, a sealing agent for the light emitting element same as the above-mentioned LED devices 1-1 to 1-22 was used to form a sealing layer 7 having a thickness of 1.5 μm directly on the LED chip.

After that, a silicone resin (OE6630, manufactured by Dow Corning Corporation) in which 10% by mass of phosphor prepared by the above method was dispersed was dropped with a dispenser on the sealing layer 7 and baked at 150° C. for 1 hour to form a phosphor-containing resin layer 8. The thickness of the phosphor-containing resin layer 8 for the LED devices 3-1 to 3-22 was set to 2.5 mm.

The same evaluations were performed on the LED devices 2-1 to 2-24 in the same manner as for the LED devices 1-1 to 1-24. As the result, the same results were obtained as that of the LED devices 1-1 to 1-24.

Further, the same evaluations were performed on the LED devices 3-1 to 3-22 in the same manner as for the LED devices 1-1 to 1-22. As the result, the same results were obtained as that of the LED devices 1-1 to 1-22.

Furthermore, LED devices 3-23 to 3-26 were produced by adjusting the film thickness of the sealing layer 7 on the basis of the LED device 3-18, and "adhesiveness", "crack resistance", "sulfurization resistance", and "wet heat resistance" evaluations were performed thereon in examples 16 to 19. The evaluation results of those are summarized in FIG. 3F. FIG. 3F is a table in which each condition and evaluation result of the examples 16 to 19 are summarized. The film thickness adjusting is performed by adjusting a coating amount of the sealing agent for the light emitting element.

Example 16

Production of LED Device 3-23

Next, as the example 16, specific production conditions and evaluation results of the LED device 3-23, as a sample, are described. In the present example, the sealing layer 7 was formed so as to have a film thickness of 0.7 μm. Other conditions are the same as that of the LED device 3-18.

As shown in FIG. 3E, the evaluation results in the example 16 are such that "○" in the adhesiveness, "○" in the crack resistance, "○" in the sulfurization resistance, and "○" in the wet heat resistance.

Example 17

Production of LED Device 3-24

Next, as the example 17, specific production conditions and evaluation results of the LED device 3-24, as a sample, are described. In the present example, the sealing layer 7 was formed so as to have a film thickness of 1.5 μm. Other conditions are the same as that of the LED device 3-18.

As shown in FIG. 3E, the evaluation results in the example 17 are such that "○" in the adhesiveness, "○" in the crack resistance, "⊚" in the sulfurization resistance, and "○" in the wet heat resistance.

Example 18

Production of LED Device 3-25

Next, as the example 18, specific production conditions and evaluation results of the LED device 3-25, as a sample, are described. In the present example, the sealing layer 7 was formed so as to have a film thickness of 5 μm. Other conditions are the same as that of the LED device 3-18.

As shown in FIG. 3E, the evaluation results in the example 18 are such that "○" in the adhesiveness, "○" in the crack resistance, "⊚" in the sulfurization resistance, and "○" in the wet heat resistance.

Example 19

Production of LED Device 3-26

Next, as the example 19, specific production conditions and evaluation results of the LED device 3-26, as a sample, are described. In the present example, the sealing layer 7 was formed so as to have a film thickness of 15 μm. Other conditions are the same as that of the LED device 3-18.

As shown in FIG. 3F, the evaluation results in the example 19 are such that "○" in the adhesiveness, "○" in the crack resistance, "○" in the sulfurization resistance, and "○" in the wet heat resistance.

In the examples 16 to 19, when the solid Si-NMR spectrum was performed on the sealing layer for the LED device 3-23 to the LED device 3-26, the $Q''$ peak group having a half width of 9 ppm, the $T''$ peak group having a half width of 9 ppm, and the $D''$ peak group having a half width of 9 ppm were observed. Further, the silanol content ratio in the sealing layer was 20%.

As the above evaluation results show, when the light emitting device was produced, as shown in FIG. 2C, with the above-described sealing material for the light emitting device (for example, the sealing material used for the LED device 3-28), it was confirmed that excellent adhesiveness, crack resistance, sulfurization resistance, and wet heat resistance can be obtained in a sealing layer film thickness range of 0.7 µm or more and 15 µm or less.

Example 20

Production of LED Device 3-27

Next, as an example 20, specific production conditions and evaluation results of the LED device 3-27, as a sample, are described. In the present example, a sealing agent for the light emitting device was prepared by further adding dibenzo-18-crown 6-ether so as to afford 2% by weight based on a total solid content to the sealing agent for the light emitting device used in the LED device 3-18 production. Other conditions are the same as that of the LED device 3-18.

As shown in FIG. 3F, the evaluation results in the example 20 are such that "○" in the adhesiveness, "○" in the crack resistance, "○" in the sulfurization resistance, and "⊚" in the wet heat resistance.

Example 21

Production of LED Device 3-28

Next, as an example 21, specific production conditions and evaluation results of the LED device 3-28, as a sample, are described. In the present example, a sealing agent for the light emitting device was prepared by further adding 3-aminopropyltrimethoxysilane so as to afford 1% by weight based on a total solid content to the sealing agent for the light emitting device used in the LED device 3-18 production. Other conditions are the same as that of the LED device 3-18.

As shown in FIG. 3F, the evaluation results in the example 21 are such that "○" in the adhesiveness, "○" in the crack resistance, "○" in the sulfurization resistance, and "⊚" in the wet heat resistance.

Example 22

Production of LED Device 3-29

Next, as an example 22, specific production conditions and evaluation results of a LED device 3-29, as a sample, are described. In the present example, a sealing agent for the light emitting device was prepared by further adding 3-mercaptopropylmethyldimethoxysilane so as to afford 1% by weight based on a total solid content to the sealing agent for the light emitting device used in the LED device 3-18 production. Other conditions are the same as that of the LED device 3-18.

As shown in FIG. 3F, the evaluation results in the example 22 are such that "⊚" in the adhesiveness, "○" in the crack resistance, "⊚" in the sulfurization resistance, and "⊚" in the wet heat resistance.

Example 23

Production of LED Device 3-30

Next, as an example 23, specific production conditions and evaluation results of a LED device 3-30, as a sample, are described. In the present example, a sealing agent for the light emitting device was prepared by further adding dibenzo-18-crown 6-ether so as to afford 1% by weight based on a total solid content and 3-aminopropyltrimethoxysilane so as to afford 0.5% by weight based on the total solid content to the sealing agent for the light emitting device used in the LED device 3-18 production. Other conditions are the same as that of the LED device 3-18.

As shown in FIG. 3F, the evaluation results in the example 23 are such that "○" in the adhesiveness, "○" in the crack resistance, "○" in the sulfurization resistance, and "⊚" in the wet heat resistance.

Example 24

Production of LED Device 3-31

Next, as an example 24, specific production conditions and evaluation results of a LED device 3-31, as a sample, are described. In the present example, a sealing agent for the light emitting device was prepared by further adding dibenzo-18-crown 6-ether so as to afford 1% by weight based on a total solid content and 3-mercaptopropylmethyldimethoxysilane so as to afford 0.5% by weight based on the total solid content to the sealing agent for the light emitting device used in the LED device 3-18 production. Other conditions are the same as that of the LED device 3-18.

As shown in FIG. 3F, the evaluation results in the example 24 are such that "⊚" in the adhesiveness, "○" in the crack resistance, "⊚" in the sulfurization resistance, and "⊚" in the wet heat resistance.

The LED devices 1-27 to 1-31, which have been produced with the sealing agent for the light emitting device used in the example 20 to the example 24, of the first mode according to the invention illustrated in FIG. 2A and the LED devices 2-27 to 2-31 of the second mode according to the invention illustrated in FIG. 2B were also evaluated in the same way as the LED devices 3-27 to 3-31. As the result, the same evaluation results were obtained for all of the LED devices as same as that of the LED devices 3-27 to 3-31.

In the examples 20 to 24, when the solid Si-NMR spectrum was performed on each of the sealing layers for the LED device 3-27 to the LED device 3-31, the $Q^n$ peak group having a half width of 9 ppm, the $T^n$ peak group having a half width of 9 ppm, and the $D^n$ peak group having a half width of 9 ppm were observed for each case. Further, the silanol content ratio in each of the sealing layers was 20%.

As the above evaluation results show, it is possible to obtain further good wet heat resistance by forming a sealing layer with the above-described sealing agent for the light emitting device (for example, the sealing materials used for the LED devices 3-27 to 3-31) including either one or both of the above-mentioned cycle ether compound and the silane coupling agent.

As described above, the sealing material for the light emitting device according to the invention satisfies the following conditions:

in the solid Si-NMR spectrum, a peak has a peak top in a chemical shift within a range of −120 ppm or more and −90 ppm or less (that is, a $Q^n$ peak group), and a half width of 5 ppm or more and 12 ppm or less;

in the solid Si-NMR spectrum, a peak has a peak top in a chemical shift within a range of −80 ppm or more and −40 ppm or less (that is, a $T^n$ peak group), and a half width of 5 ppm or more and 12 ppm or less; and a silanol content ratio is 11% by weight or more and 30% by weight or less.

Thus, the sealing material for the light emitting device is able to achieve both the adhesiveness and the crack resistance, and obtain the high sulfurization resistance and wet heat resistance.

EXPLANATION OF SYMBOLS

1 LED SUBSTRATE
2 METAL PORTION
3 LED CHIP
4 BUMP ELECTRODE
5 GLASS SUBSTRATE
6 WAVELENGTH CONVERSION TYPE SEALING LAYER
7 SEALING LAYER
8 PHOSPHOR-CONTAINING RESIN LAYER
100 LED DEVICE

The invention claimed is:

1. A sealing material for a light emitting device for sealing a light emitting element, wherein:
   in a solid Si-nuclear magnetic resonance spectrum, a peak has a peak top in a chemical shift within a range of −120 ppm or more and −90 ppm or less, and a half width of 5 ppm or more and 12 ppm or less;
   in the solid Si-nuclear magnetic resonance spectrum, a peak has a peak top in a chemical shift within a range of −80 ppm or more and −40 ppm or less, and a half width of 5 ppm or more and 12 ppm or less; and
   a silanol content ratio is 11% by weight or more and 30% by weight or less.

2. The sealing material for the light emitting device according to claim 1, containing inorganic oxide fine particles.

3. The sealing material for the light emitting device according to claim 2, wherein the inorganic oxide fine particles are $ZrO_2$.

4. The sealing material for the light emitting device according to claim 1, containing a cyclic ether compound.

5. The sealing material for the light emitting device according to claim 1, containing a silane coupling agent.

6. The sealing material for the light emitting device according to claim 1, containing phosphor particles.

7. A light emitting device in which at least a light emitting surface of an light emitting element is covered with a sealing layer, wherein
   the sealing layer having a film thickness of 10 μm or more and less than 500 μm is formed with the sealing material for the light emitting device according to claim 1.

8. A light emitting device, in which at least a light emitting surface of a light emitting element is covered with a sealing layer, comprising a phosphor-containing resin layer containing a resin and phosphor particles on the sealing layer, wherein
   the sealing layer is formed with the sealing material for the light emitting device according to claim 1, and has a film thickness of 0.7 μm or more and 15 μm or less.

9. The light emitting device according to claim 7, wherein the light emitting element is a light emitting diode.

10. A production method of a light emitting device in which at least a light emitting surface of a light emitting element is covered with a sealing layer, comprising the steps of:
    applying a sealing agent for the light emitting device onto the light emitting element; and
    forming a sealing layer containing the sealing material for the light emitting element according to claim 1 by curing the sealing agent for the light emitting device at 80° C. or more.

11. The light emitting device according to claim 8, wherein the light emitting element is a light emitting diode.

* * * * *